(12) United States Patent
Furuta et al.

(10) Patent No.: US 7,129,869 B2
(45) Date of Patent: Oct. 31, 2006

(54) SUPERCONDUCTOR SEMICONDUCTOR INTEGRATED CIRCUIT

(75) Inventors: Futoshi Furuta, Kokubunji (JP); Kazuo Saitoh, Kodaira (JP)

(73) Assignees: Hitachi, Ltd., Tokyo (JP); International Superconductivity Technology Center, the Jurdical Foundation, Tokyo (JP)

( * ) Notice: Subject to any disclaimer, the term of this patent is extended or adjusted under 35 U.S.C. 154(b) by 381 days.

(21) Appl. No.: 10/862,418

(22) Filed: Jun. 8, 2004

(65) Prior Publication Data
US 2005/0047245 A1 Mar. 3, 2005

(30) Foreign Application Priority Data
Aug. 28, 2003 (JP) ............... 2003-304876

(51) Int. Cl.
*H03M 1/00* (2006.01)
(52) U.S. Cl. ...................... 341/133; 341/126
(58) Field of Classification Search ........... 341/133, 341/126
See application file for complete search history.

(56) References Cited
U.S. PATENT DOCUMENTS
2001/0025012 A1* 9/2001 Tarutani et al. ............ 505/100
2002/0060635 A1* 5/2002 Gupta ...................... 341/133

FOREIGN PATENT DOCUMENTS
JP 2001-345488 3/2001
JP 2002-374152 6/2001

OTHER PUBLICATIONS
K. K. Likharev et al., "RSFQ Logic Memory Family: A New Josephson-Junction Technology for Sub-Terahertz-Clock-Frequency Digital Systems", IEEE Transactions on Applied Superconductivity, vol. 1, No. 1, Mar. 1991, pp. 3-28.

* cited by examiner

*Primary Examiner*—Rexford Barnie
*Assistant Examiner*—Joseph Lauture
(74) *Attorney, Agent, or Firm*—Reed Smith LLP; Stanley P. Fisher, Esq.; Juan Carlos A. Marquez, Esq.

(57) ABSTRACT

In an A/D converter having a single flux quantum circuit having a flux quantum as an information carrier, a superconducting amplifier circuit driven by an AC current, and a semiconductor circuit, the operations of the circuits are synchronized with each other and a data signal from the single flux quantum circuit is transmitted to the semiconductor circuit.

An AC current as the power source of a superconducting amplifier circuit is inputted as a master clock signal to the single flux quantum circuit and the semiconductor circuit to synchronize the operations of the circuits with the master clock signal. The single flux quantum circuit has a clock signal frequency multiplier circuit, a demultiplexing circuit and a memory circuit.

11 Claims, 18 Drawing Sheets

FIG. 16
(A)
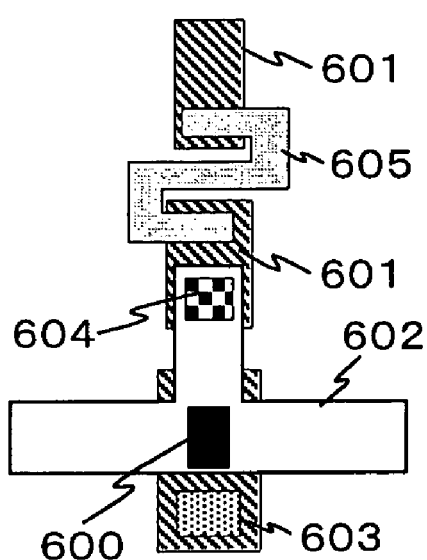
(B)
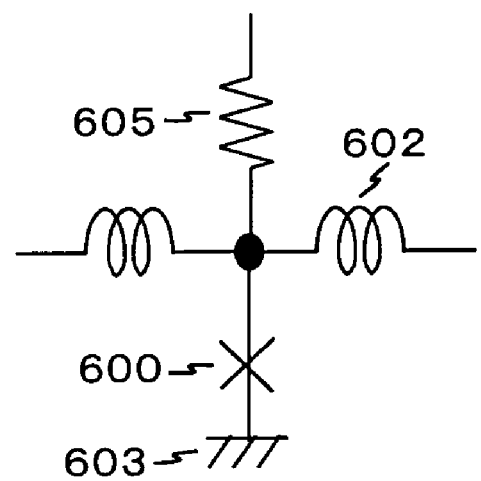

SUPERCONDUCTOR SEMICONDUCTOR INTEGRATED CIRCUIT

CLAIM OF PRIORITY

The present application claims priority from Japanese application JP 2003-304876 filed on Aug. 28, 2003, the content of which is hereby incorporated by reference into this application.

FIELD of the Invention

The present invention relates to a superconducting circuit including a single flux quantum circuit and to an integrated circuit combining the superconducting circuit with semiconductor circuits.

BACKGROUND OF THE INVENTION

A single flux quantum (hereinafter, abbreviated as SFQ) circuit having a single flux quantum ($\Phi_0$=h/2e=2.07×10$^{-15}$ Weber) as an information carrier is a superconducting circuit featuring an ultrafast operation above tens of GHz (10$^9$ Hz) and a low power consumption characteristic below microwatt (µW) per gate. Based on the principle shown in Non-Patent Document 1 (IEEE Trans. on Appl. Supercond., vol. 1, No. 1 (1991) p. 1), various logic gates have been developed, and the development of practical circuits combining these with each other is widely advanced.

As an application of an SFQ circuit, there is an analog-to-digital (hereinafter, abbreviated as A/D) converter. To exploit the feature of the SFQ circuit, an oversampling method-is employed for the conversion method. In this method, an input signal is sampled (oversampled) at a frequency sufficiently higher than a bandwidth with accuracy of a small number of bits, and its sampling data signal is then signal-processed to obtain a digital data signal with high accuracy in a necessary bandwidth. A front-end circuit performing oversampling is constructed of the SFQ circuit operable at tens of GHz, and a back-end circuit performing signal processing is constructed of a semiconductor circuit excellent in integration properties, thereby realizing a high-performance A/D converter.

[Patent Document 1]
Japanese Patent Application Laid-Open No. 2002-374152
[Patent Document 2]
Japanese Patent Application Laid-Open No. 2001-345488
[Non-Patent Document 1] IEEE Trans. on Appl. Supercond., vol. 1, No. 1 (1991) p. 3

SUMMARY OF THE INVENTION

When putting the SFQ circuit as well as the A/D converter to practice use, the synchronous operation of the SFQ circuit and the semiconductor circuit is essential. The first problem in realizing the synchronous operation is signal transmission from the SFQ front-end circuit to the semiconductor back-end circuit. In the SFQ circuit, the SFQ as an information carrier is propagated as a voltage pulse. The energy of the voltage pulse (hereinafter, represented as an SFQ pulse) is very small, the pulse width is about 3 ps, and the largest voltage is about 1 mV. The typical input voltage level of the semiconductor circuit is several or tens of mV at a signal frequency of several GHz, that is, at a pulse width of 100 ps. It is impossible to directly transmit the SFQ pulse from the SFQ circuit to the semiconductor circuit. In general, a single flux quantum (SFQ) to dc converter circuit is used to convert the SFQ pulse to the change of the voltage level. The single flux quantum (SFQ) to dc converter circuit has a function, for each input of the SFQ pulse, of transiting its output between the voltage state and the zero-voltage state.

The output data rate of a data signal from the SFQ circuit performing oversampling is high which is tens of GHz. When the single flux quantum (SFQ) to dc converter circuit is used, the pulse width of its output voltage is only tens of ps, which is still narrow to be handled in the semiconductor circuit. The signal transmission from the SFQ circuit to the semiconductor circuit must lower the data rate on the side of the superconducting circuit including the SFQ circuit.

To lower the data rate, a demultiplexing circuit is used. The demultiplexing circuit demultiplexes a data signal into a plurality of channels to lower the data rate per channel. There are two circuit methods of a binary-tree type and a shift-dump type. The binary-tree type demultiplexing circuit demultiplexes a data signal stepwise to lower the data rate. It is suitable for high-speed demultiplexing of the data signal since the entire demultiplexing circuit need not be operated at the same frequency. The output timing of the demultiplexed data signal is different for each channel, which makes timing calibration with the later-stage circuit difficult. The shift-dump type demultiplexing circuit demultiplexes a data signal at a time. The output timings are equal in all channels, and connection to the later-stage circuit is easy. The entire demultiplexing circuit must be operated at the same frequency. When the number of demultiplexing channels is large, high-speed demultiplexing of the data signal is difficult. Desirably, the demultiplexing circuit enables high-speed demultiplexing of a data signal and the output timings are equal. There have been no circuit methods having the features of both types.

To transmit a data signal to the semiconductor circuit, the signal must be amplified. To obtain a voltage signal at tens of mV in the superconducting circuit, an AC-biased superconducting amplifier circuit must be used. An AC bias current supplied to the amplifier circuit affects another SFQ circuit due to cross talk, causing the SFQ circuit to malfunction.

The second problem in performing the synchronous operation of the SFQ circuit and the semiconductor circuit is a difficulty of clock-supply to the SFQ front-end circuit and the semiconductor back-end circuit. In the synchronous operation, a clock signal common to both circuits, that is, a master clock signal is necessary. When generating the master clock on the SFQ circuit side, it is easy to allow the clock frequency to be tens of GHz as the operating frequency of the SFQ circuit. When using a method of frequency-dividing the master clock signal to lower the frequency to several GHz, it is impossible to transmit it to the semiconductor circuit. When the frequency-divided clock signal is not synchronized with the AC bias current supplied to the superconducting amplifier circuit, the superconducting amplifier circuit cannot efficiently amplify the clock signal. There has not been any means supplying the AC bias current to the superconducting amplifier circuit in synchronization with the clock signal inputted to the superconducting amplifier circuit.

There is considered a method of generating a master clock signal of several GHz by the semiconductor circuit to multiply the frequency of the master clock signal in the SFQ circuit. In this case, there is used a method of using a ladder-type clock signal generating circuit as a known circuit to generate a finite number of SFQ pulses during one cycle of the master clock signal. Unless the cycle of the master clock signal is equal to the SFQ pulse generation period of the ladder-type clock signal generating circuit, the cycle of the generated clock signal is not uniform to affect the conversion accuracy of an input signal in oversampling. There have been no methods of checking and controlling the uniformity.

To the above problems, in the present invention, to perform the synchronous operation of the superconducting front-end circuit and the semiconductor back-end circuit, an AC signal outputted from the power supply for the superconducting amplifier circuit is inputted as the master clock signal to the SFQ front-end circuit and the semiconductor back-end circuit. As a result, when an output signal from the front-end circuit is inputted to the superconducting amplifier circuit and an output signal of the superconducting amplifier circuit is inputted to the semiconductor back-end circuit, both circuits are operated by the common master clock signal in which the power supply for the superconducting amplifier circuit is an AC signal source.

The SFQ front-end circuit has a clock signal frequency multiplier circuit synchronized with a master clock signal of several GHz to multiply its frequency for generating an internal clock signal of tens of GHz. To multiply the frequency of the clock signal, used is a ladder-type clock signal generating circuit generating a finite number of SFQ pulses as in the prior art or a ring oscillator circuit generating an infinite number of SFQ pulses. Either circuit has a construction frequency-dividing the generated internal clock signal and the single flux quantum (SFQ) to dc converter circuit.

When using the ladder-type clock signal generating circuit, to check the uniformity of the cycle of the internal clock signal, the generated internal clock signal is passed through the frequency divider circuit and the single flux quantum (SFQ) to dc converter circuit. The ratio of the cycle of the master clock signal to the pulse interval between the internal clock signals is converted to the duty ratio of the output waveform of the single flux quantum (SFQ) to dc converter circuit. In order that the duty ratio is 50%, a circuit controlling the bias current of the ladder-type clock signal generating circuit is added to generate the internal clock signal whose cycle is uniform.

When using the ring oscillator circuit instead of the ladder-type clock signal generating circuit, the internal clock signal whose cycle is uniform can be generated and the internal clock signal must be synchronized with the master clock signal. The generated internal clock signal is passed through the frequency divider circuit and the single flux quantum (SFQ) to dc converter circuit. A phase of the output signal is compared with that of the master clock signal. The result of the comparison is fed back to the bias current source of the ring oscillator circuit to control the bias current value.

The SFQ front-end circuit has, in addition to the clock signal frequency multiplier circuit, a modulator circuit, a demultiplexing circuit and a memory circuit. The modulator circuit oversamples an inputted analog signal according to the internal clock signal generated by the clock signal frequency multiplier circuit. The demultiplexing circuit consists of a binary-tree type demultiplexing circuit and a shift-dump type demultiplexing circuit. The two different types of demultiplexing circuits are connected to each other to exploit the features of both types. An SFQ data signal outputted from the modulator circuit is high-speed demultiplexed by the binary-tree type demultiplexing circuit to lower its frequency. The shift-dump type demultiplexing circuit further demultiplexes the SFQ data signal and makes the output timings equal to facilitate timing design with the later-stage circuit.

The data signal from the demultiplexing circuit is once held in the memory circuit to be synchronized with the master clock signal and is then transmitted to the superconducting amplifier circuit.

The superconducting amplifier circuit has an even number (2N; N is a natural number) of amplifier circuits to reduce the influence of the AC current supplied to the superconducting amplifier circuit on the SFQ circuit. The AC bias current as the master clock signal is supplied to N amplifier circuits, and an AC bias current of the opposite polarity is supplied to the remaining N amplifier circuits. The wires flowing the two AC bias currents are arranged to be close to each other to cancel the AC component.

According to the present invention, an A/D converter having a single flux quantum circuit having a flux quantum as an information carrier, a superconducting circuit driven by an AC current and a semiconductor circuit can synchronize the operations of the circuits with each other to easily transmit a data signal from the single flux quantum circuit to the semiconductor circuit.

BRIEF DESCRIPTION OF THE DRAWINGS

FIG. 16 is a diagram of assistance in explaining the component devices of FIG. 15;

DESCRIPTION OF THE PREFERRED EMBODIMENT

The present invention will be described by the following embodiments. The embodiments are an example using the present invention. The present invention is not limited by the embodiments.

(Embodiment 1)

In Embodiment 1, the overall construction and operation of an A/D converter will be described. The detailed construction and operation of components will be then described.

(The Overall Construction of an A/D Converter)

Figure 1:
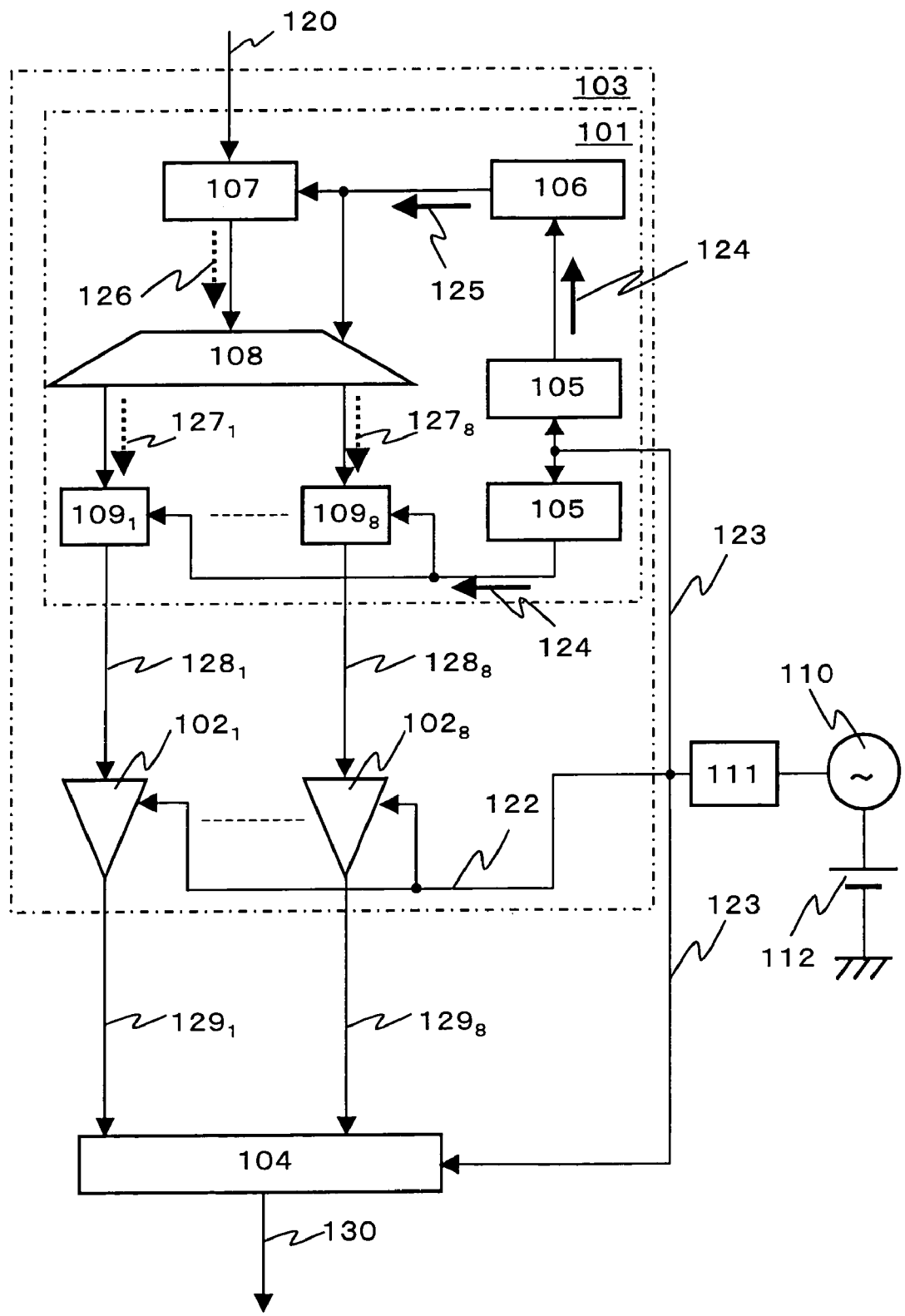
FIG. 1 is a diagram showing the overall construction of an A/D converter according to Embodiment 1.

FIG. 1 is a diagram showing the overall construction of an A/D converter according to Embodiment 1. The converter has a superconducting front-end circuit 103 having an SFQ front-end circuit 101 and a superconducting amplifier circuit 102, and a semiconductor back-end circuit 104. The superconducting front-end circuit 103 oversamples an analog input signal 120, converts the analog signals to the digital data signals and makes the frequency and the voltage level of the data signals transmittable to the semiconductor back-end circuit 104. The semiconductor back-end circuit 104 signal-processes a voltage data signal 129 of the superconducting front-end circuit 103 to generate a final digital data signal 130.

Figure 2:
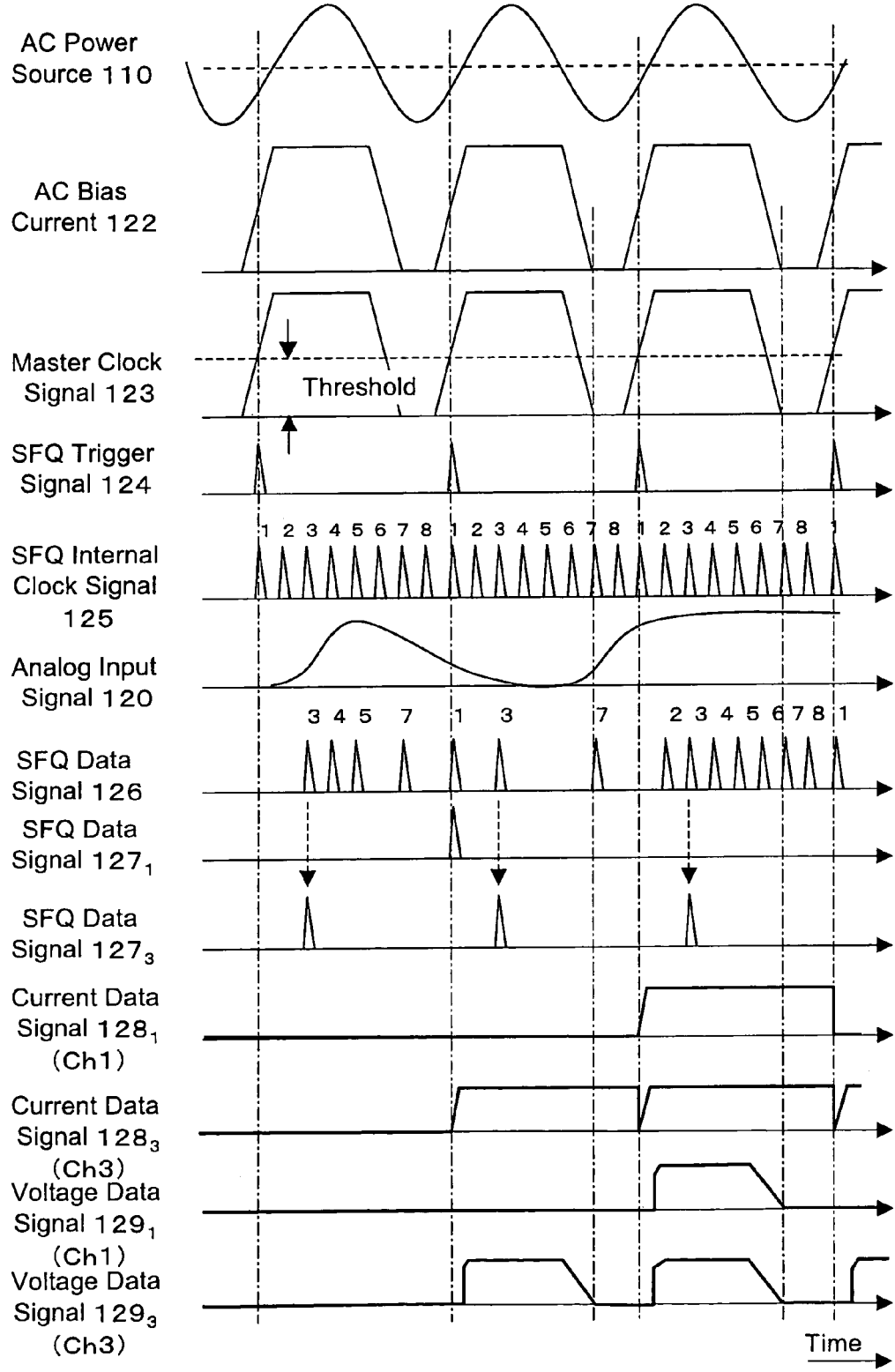
FIG. 2 is a diagram showing a time chart of signals of the circuits of the A/D converter.

FIG. 2 is a diagram showing a time chart of signals of the circuits of the A/D converter. The operation of the A/D converter shown in FIG. 1 will be described with reference to FIG. 2. In the following description, in the drawing, the flows of the clock signals of SFQ pulse signals are indicated by the thick solid lines, and the flows of the data signals thereof are indicated by the thick dotted lines.

The AC current from an AC power source 110 to which an offset voltage of a dc voltage source 112 is added is converted to a trapezoid-shaped pulsating current by a saturable circuit 111. The pulsating current is inputted as an AC bias current 122 to the superconducting amplifier circuit 102, and is inputted as a master clock signal 123 to the SFQ front-end circuit 101 and the semiconductor back-end circuit 104. The master clock signal 123 inputted to the SFQ front-end circuit 101 decides the generation timing of an SFQ trigger signal 124 in an SFQ generating circuit 105. When the current level of the master clock signal 123 exceeds a threshold shown in FIG. 2, the SFQ signal generating circuit 105 generates one SFQ pulse. The pulse is inputted as the SFQ trigger signal 124 to a clock signal frequency multiplier circuit 106. The clock signal frequency multiplier circuit 106 is synchronized with the SFQ trigger signal 124 to generate a finite number of SFQ pulse trains. The SFQ pulse train is called an SFQ internal clock signal 125.

A modulator circuit 107 oversamples the inputted analog signal 120 and outputs an SFQ data signal 126 in synchronization with the SFQ internal clock signal 125. The magnitude of the analog signal is reflected in the density of the SFQ data signals 126. The SFQ data signal 126 is demultiplexed as SFQ data signals $127_1, \ldots, 127_8$ to a plurality of output channels by a demultiplexing circuit 108. The demultiplexed SFQ data signal 127 is once stored in memory circuits $109_1, \ldots, 109_8$. The SFQ trigger signal 124 synchronized with the master clock signal 123 is inputted to the memory circuits $109_1, \ldots, 109_8$. The SFQ data signals stored in the memory circuits $109_1, \ldots, 109_8$ are converted to current data signals $128_1, \ldots, 128_8$ to be transmitted to the superconducting amplifier circuits $102_1, \ldots, 102_8$. The superconducting amplifier circuits $102_1, \ldots, 102_8$ to which the AC bias current 122 is supplied, when there are the outputs of the memory circuits $109_1, \ldots, 109_8$, output voltage data signals $129_1, \ldots, 129_8$ of tens of mV synchronizing with the AC bias current 122. The AC bias current 122 is the same as the master clock signal 123. The operations of the superconducting amplifier circuits $102_1, \ldots, 102_8$ are synchronized with the operations of the memory circuits $109_1, \ldots, 109_8$ as the outputs of the SFQ circuit 101.

In the time chart shown in FIG. 2, the number of generated SFQ pulses by the clock signal frequency multiplier circuit 106 is eight, and the number of channels of the demultiplexing circuit 108 is also eight. In FIG. 2, the SFQ internal clock signal 125 is generated in each cycle of the master clock signals as given numbers 1 to 8. The SFQ internal clock signals 125 given the numbers 1 to 8 are supplied to the modulator circuit 107. In the first cycle, the third, fourth, fifth and seventh SFQ pulses are outputted as the SFQ data signal 126. In the next cycle, the first, third and seventh SFQ pulses are outputted as the SFQ data signal 126. In the following cycle, the second to eighth SFQ pulses are outputted as the SFQ data signal 126. The demultiplexing circuit 108 demultiplexes the data signals to the eight output channels. In FIG. 2, for the first and third channels, the SFQ data signals $127_1, 127_3$, the current data signals $128_1, 128_3$, and the voltage data signals $129_1, 129_3$ are shown.

The SFQ data signals $127_1, 127_3$, the current data signals $128_1, 128_3$, and the voltage data signals $129_1, 129_3$ will be a little further described here. The memory circuit 109 will be described later with reference to FIG. 11 and is formed by a shift register having two data flip-flop circuits cascade connected. The SFQ data signals $127_1, 127_3$ are stored in the first data flip-flop circuits of the memory circuits $109_1, 109_3$, of the respective channels. Synchronized with the SFQ trigger signal 124 added in the later cycle, the stored data signals are then moved to the second data flip-flop circuits for outputting the current data signals $128_1, 128_3$ in this stage. The outputs disappear in synchronization with the SFQ trigger signal 124 added in the later cycle. When the current data signals $128_1, 128_3$ are outputted, the operations of the superconducting amplifier circuits $102_1, 102_3$ let the voltage data signals $129_1, 129_3$ appear. The voltage data signals $129_1, 129_3$ disappear when the AC bias current 122 is 0. The voltage data signals $129_1, 129_3$ appear at the point of time which is a little bit later than the current data signals $128_1, 128_3$, because the threshold to the AC bias current 122 of the superconducting amplifier circuits $102_1, \ldots, 102_8$ should be larger than the threshold of the master clock signal 123. When seeing the SFQ data signal $127_1$, in the stage in which the SFQ data signal $127_1$, appears, this is only stored in the first data flip-flop circuit of the memory circuit $109_1$, and nothing appears outside. After that, when the SFQ trigger signal 124 appears, the SFQ data signal $127_1$ is moved to the second data flip-flop circuit of the memory circuit $109_1$. As a result, the current data signal $128_1$ is outputted. Along with it, the voltage data signal $129_1$ is also outputted.

The voltage data signal 129 outputted from the superconducting amplifier circuit 102 is signal-processed by the semiconductor back-end circuit 104. By the signal processing (decimation), the oversampling data is converted to a final digital data signal 130. The master clock signal 123 is used as the clock signal of the semiconductor back-end circuit 104. The operation of the semiconductor back-end circuit 104 can be synchronized with the operation of the superconducting front-end circuit 101.

The master clock signal 123 is inputted to the SFQ generating circuit 105 in the SFQ front-end circuit 101 and the semiconductor back-end circuit 104. The AC bias current 122 similar to the master clock signal 123 is added to the superconducting amplifier circuit 102 to synchronize the operations of the superconductive front-end circuit 103 and the back-end circuit 104 with each other to operate the entire A/D converter.

(SFQ Basic Circuit)

Before describing the operation of the A/D converter, an equivalent circuit and the function of the basic SFQ circuit employed in the present invention will be described.

Figure 3:
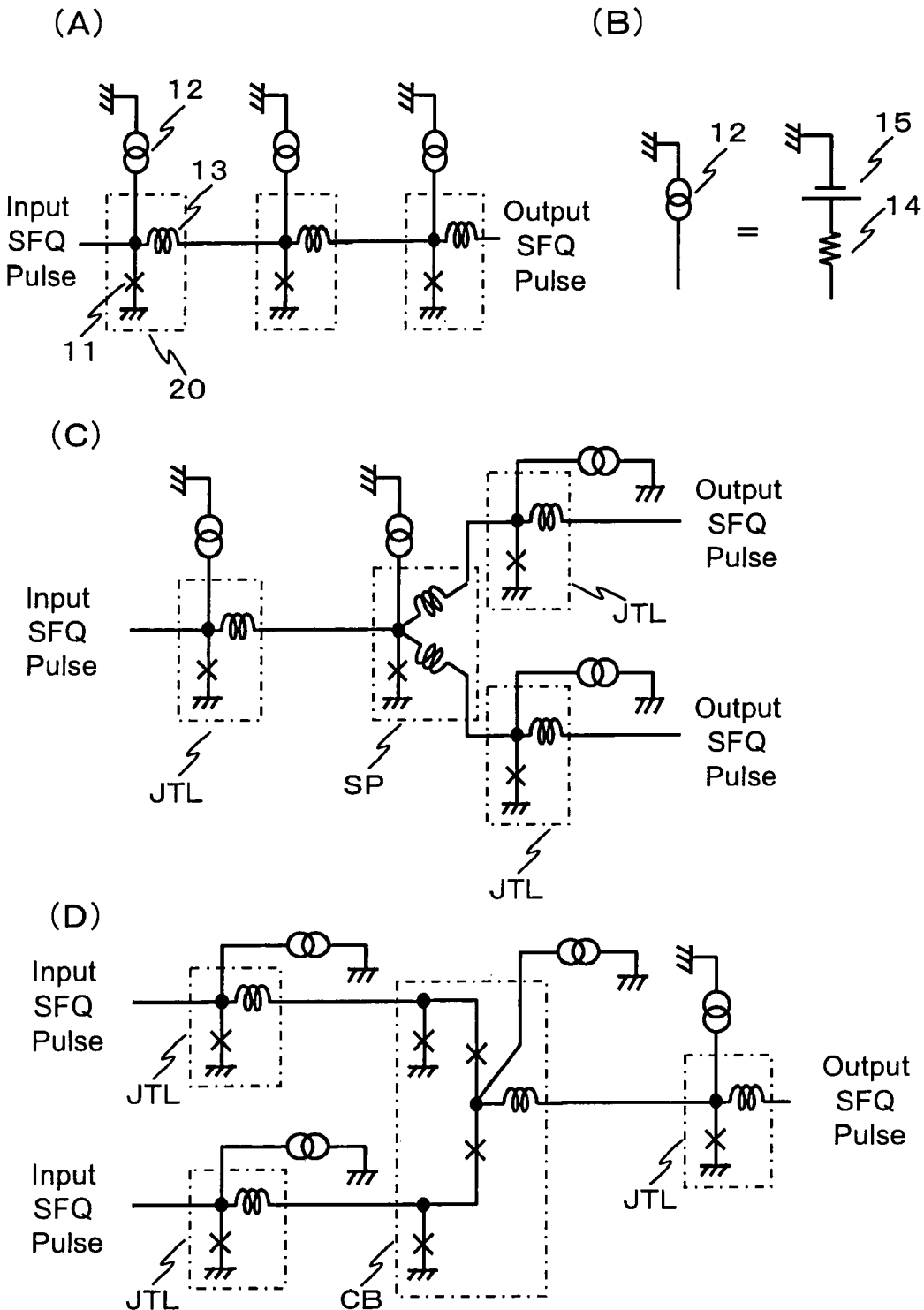
FIG. 3(A) is an equivalent circuit diagram showing Josephson transmission lines, JTLs.
FIG. 3(B) is a diagram showing that a bias current source 12 is equivalent to a series circuit of a resistance 14 and a bias voltage source 15.
FIG. 3(C) is an equivalent circuit diagram showing a splitter SP.
FIG. 3(D) is an equivalent circuit diagram showing a confluence buffer CB.

FIG. 3(A) is an equivalent circuit diagram showing Josephson transmission lines (hereinafter, abbreviated as JTL). The circuit is constructed by connecting in series a unit circuit 20 having a Josephson junction 11, a bias current source 12, and an inductor 13. The indication of the bias current source 12 may be omitted. Here, the equivalent circuit is indicated by a chain line in a form of not including the bias current source 12 therein. Other equivalent circuits are also indicated by a chain line in a form of not including the bias current source 12 therein. The JTL has a function of transmitting the SFQ pulse. The JTL is used in most cases for SFQ transmission between the SFQ element circuits. The JTL used in various circuits described below serves as a function of shaping and transmitting the SFQ pulse and is not involved in the functions of various circuits. The transmission function of the SFQ pulse owned by the JTL is important for calibrating the timing of the SFQ pulse. The size of the drawing of the embodiment is limited, not indicating the number of JTL stages in consideration of the timing of the SFQ pulse. The magnitude of the bias current of the bias current source 12 is varied to change delay time of propagation of the SFQ pulse. Notice which must be particularly taken of the timing of the SFQ pulse is described in the main body of this specification.

FIG. 3(B) is a diagram showing that the bias current source 12 is equivalent to a series circuit of a resistance 14 and a bias dc voltage source 15, which is suitably selected for use in the illustration.

FIG. 3(C) is an equivalent circuit diagram showing a splitter (hereinafter, abbreviated as SP). The SP is a circuit increasing one inputted SFQ pulse to two and is used for supplying one SFQ pulse to a plurality of element circuits.

FIG. 3(D) is an equivalent circuit diagram showing a confluence buffer (abbreviated as CB). The CB is a circuit transmitting the SFQ pulses inputted from two inputs to one output and is used for unifying a plurality of SFQ signals.

FIGS. 3(C) and 3(D) show circuit diagrams in which in addition to the SP and CB, the JTLs are arranged at the input and output ends.

(Clock Signal Frequency Multiplier Circuit)

Figure 4:
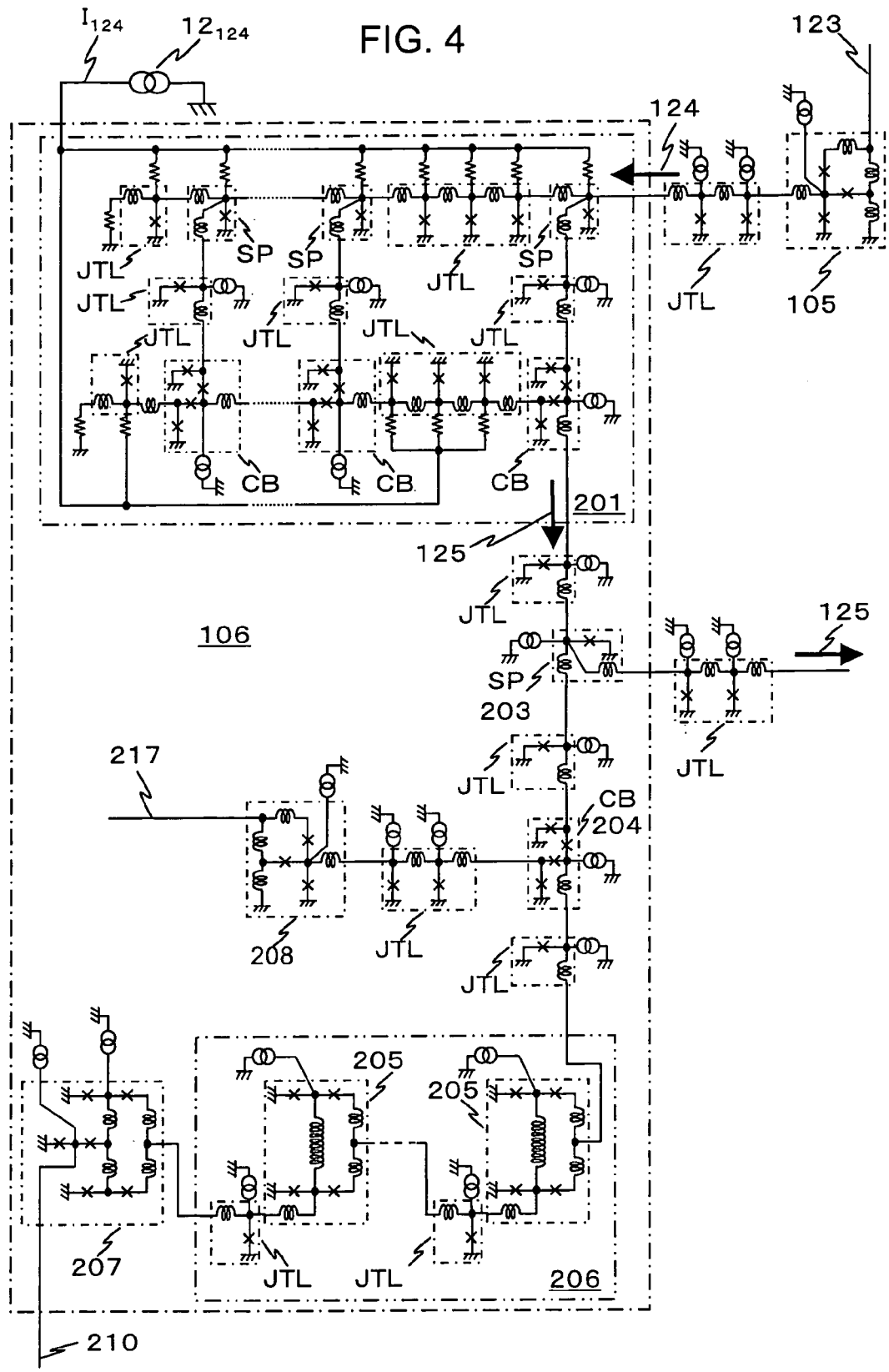
FIG. 4 is a diagram showing the constructions of equivalent circuits of an SFQ signal generating circuit 105 and an SFQ clock signal frequency multiplier circuit 106 of the A/D converter shown in FIG. 1.

FIG. 4 is a diagram showing the constructions of equivalent circuits of the SFQ signal generating circuit 105 and the SFQ clock signal frequency multiplier circuit 106 of the A/D converter shown in FIG. 1. The SFQ signal frequency multiplier circuit 106 has a $2^N$-bit ladder-type clock signal generating circuit 201, a frequency divider circuit 206, and some JTLs, SPs and CBs.

Figure 5:
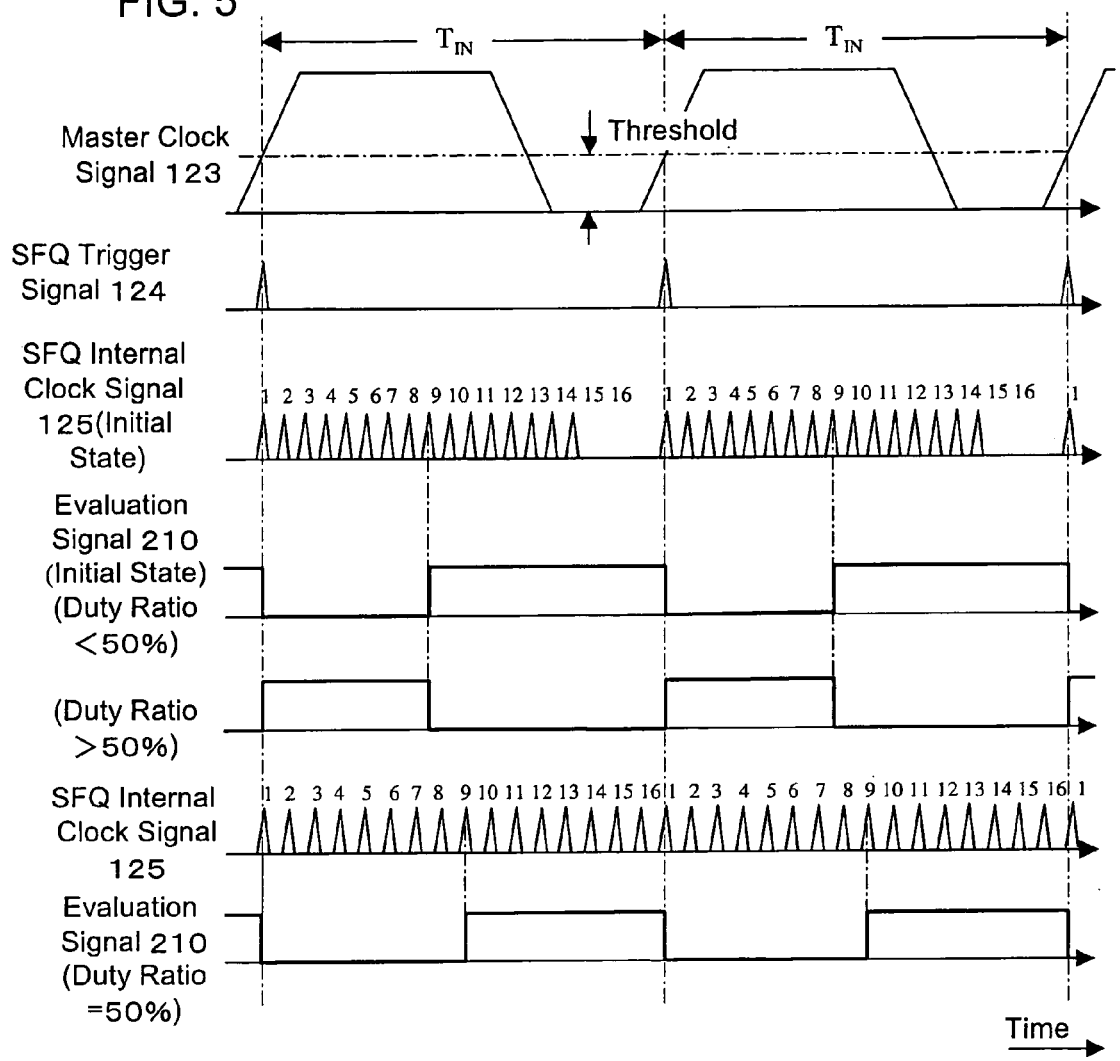
FIG. 5 is a diagram showing a time chart of main signals in the circuits of FIG. 4.

FIG. 5 is a diagram showing a time chart of main signals in the circuits of FIG. 4. With reference to FIG. 5, the detail of the circuit constructions of FIG. 4 and its operation will be described.

When the master clock signal 123 is inputted to the SFQ signal generating circuit 105, the SFQ trigger signal 124 is generated in synchronization with the master clock signal 123. The threshold of FIG. 5 is a value the SFQ signal generating circuit 105 generates the SFQ trigger signal 124. The SFQ trigger signal 124 is inputted to the $2^N$-bit ladder-type clock signal generating circuit 201 in the clock signal frequency multiplier circuit 106.

The $2^N$-bit ladder-type clock signal generating circuit 201 has the JTLs, $2^N$ SPs, and $2^N$ CBs. The SFQ trigger signal 124 is advanced to the left side in the upper stage of FIG. 4 to output the SFQ pulses split for each passage through the SP, thereby being split into $2^N$ SFQ pulses. The respective SFQ pulses are propagated on the JTLs having different delay time (the number of connections). The SFQ pulses split by the SP on the most left side of FIG. 4 are advanced to the right side in the CBs and JTLs in the lower stage to be confluent with the SFQ pulses split by the SP in the upper stage in each of the CBs. Consequently, as shown in FIG. 5, the SFQ internal clock signal 125 (initial state) having $2^N$ SFQ pulses is generated from the $2^N$-bit ladder-type clock signal generating circuit 201. The example of FIG. 5 shows the case of N=4. The last SFQ pulse split by the most left SP in the upper stage passes through the JTL in the most left stage to be grounded and disappears.

To generate the SFQ internal clock signal 125 having a uniform cycle from the master clock signal 123 in cycle $T_{IN}$, the pulse interval between the SFQ pulses (1–16 in FIG. 5) as time-series signals must be set to $T_{IN}/2^N$. The interval can be realized by calibrating bias current $I_{124}$ supplied to the JTLs constructing the $2^N$-bit ladder-type clock signal generating circuit 201 by controlling the bias current source $12_{124}$. To compare the pulse interval between the SFQ pulses as time-series signals with the cycle of the master clock signal 123, the SFQ internal clock signal (time-series signal) 125 outputted from the $2^N$-bit ladder-type clock signal generating circuit 201 is introduced via an SP 203 and a CB 204 into the $2^{N-1}$ frequency divider circuit 206 having N−1 toggle flip-flop circuits (T-FF) 205. A single flux quantum (SFQ) to dc converter circuit 207 is connected to the output end of the $2^{N-1}$ frequency divider circuit 206.

An evaluation signal 210 as the output of the single flux quantum. (SFQ) to dc converter circuit 207 is transited between the fixed voltage state and the zero-voltage state each time the SFQ pulse is generated from the $2^{N-1}$ frequency divider circuit 206. The SFQ pulse 125 generated by the ladder-type clock signal generating circuit 201 is introduced into the $2^{N-1}$ frequency divider circuit 206. The period from the first to $2^{N-1}$+one SFQ pulses of $2^N$ SFQ pulses indicates time of $2^{N-1}$ times the pulse interval between the internal time-series signals, and the period from one SFQ pulse to $2^N$+one SFQ pulses indicates the cycle $T_{IN}$ of the master clock signal. The output SFQ pulses from the $2^{N-1}$ frequency divider circuit 206 are added to the single flux quantum (SFQ) to dc converter circuit 207 to measure the duty ratio of the voltage of the evaluation signal 210 as the output of the single flux quantum (SFQ) to dc converter circuit 207, thereby comparison the pulse interval between the SFQ pulses 125 with the cycle of the master clock signal 123 can be performed. Using the comparison result of the cycle, the bias current source $12_{124}$ is controlled to change the bias current $I_{124}$. The cycle of the SFQ internal clock signal (pulse time-series signal) 125 outputted by the ladder-type clock signal generating circuit 201 is controlled so that the duty ratio of the voltage of the evaluation signal 210 is 50%. This point will be described in the bias current control circuit described later.

The SFQ pulse according to another master clock signal 217 can be inputted via an SFQ generating circuit 208 and the CB 204 to the $2^{N-1}$ frequency divider circuit 206. The master clock signal 217 will be described in the control circuit of the bias current source $12_{124}$ described next.

(Bias Current Control Circuit)

Figure 6:
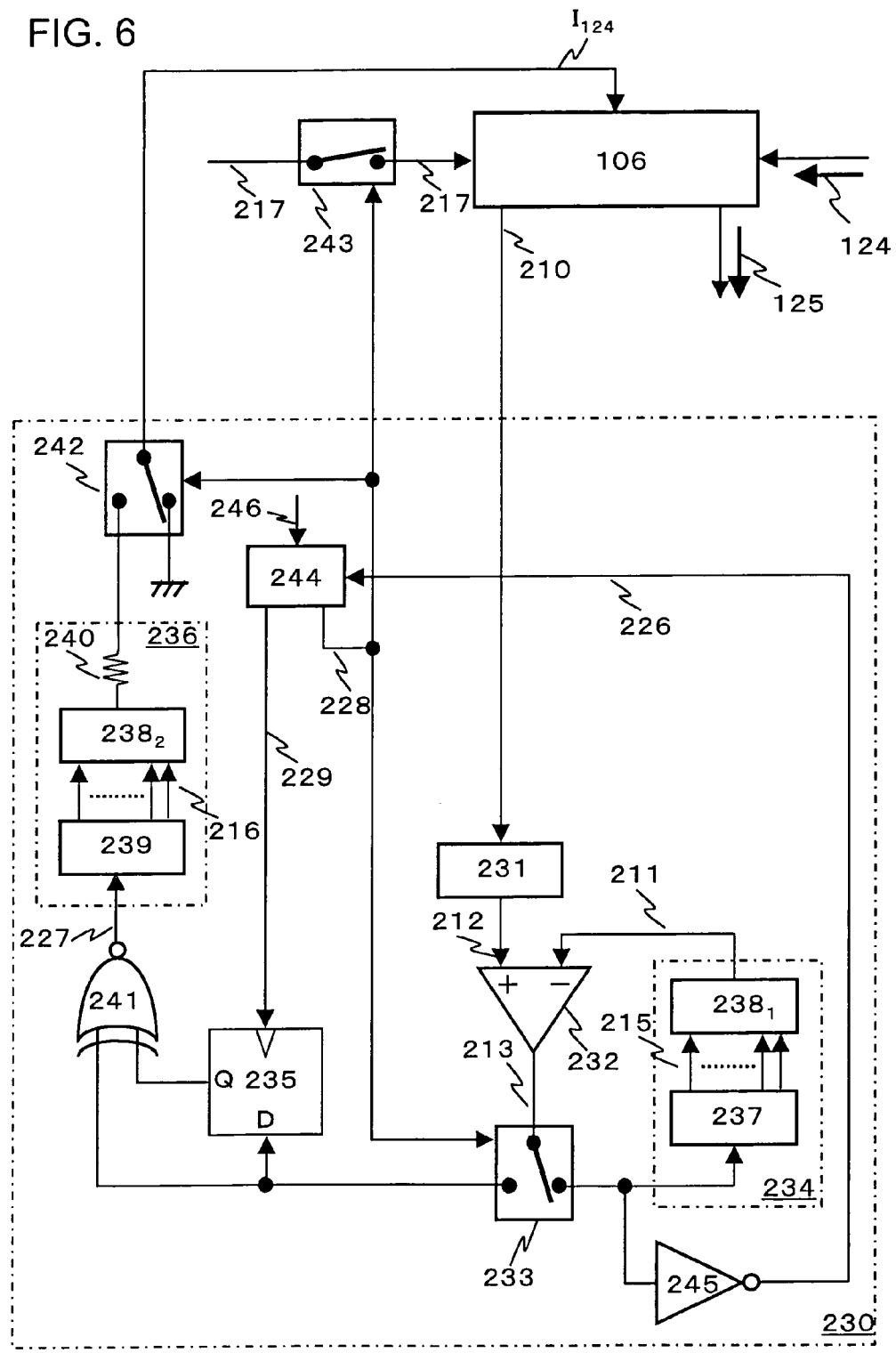
FIG. 6 is a block diagram of a control circuit automatically calibrating bias current $I_{124}$ so that the duty ratio of an SFQ internal clock signal 125 is 50%.

To generate the SFQ internal clock signal 125 whose cycle is uniform, as shown in FIG. 2, the duty ratio of the evaluation output 210 must be 50%. FIG. 6 is a block diagram of a control circuit automatically calibrating the bias current $I_{124}$ so that the duty ratio of the SFQ internal clock signal 125 is 50%. A control circuit 230 has a low-pass filter circuit 231, a comparator circuit 232, a variable voltage source 234, a variable bias current source 236, a sequencer circuit 244, several logic circuits 235, 241 and 245, and switch circuits 233, 242 and 243. These element circuits are all semiconductor circuits. The variable voltage source 234 has an up counter circuit 237 and a digital-to-analog converter circuit (D/A converter circuit) $238_1$. The variable bias current source 236 has a down counter circuit 239, the D/A converter circuit $238_2$, and a bias resistance 240. Here, the variable bias current source 236 corresponds to the bias current source $12_{124}$ described in FIG. 4.

The operation of the control circuit 230 has a first step of setting a reference voltage 211 inputted to the comparator circuit 232, and a second step of comparing the set reference voltage 211 with the evaluation output 210 to set the bias current $I_{124}$. The operations of the first and second steps are switched by the switch circuits 233, 242 and 243 and the sequencer circuit 244. The sequencer circuit 244 sequentially outputs control signals 228 and 229 in predetermined timing by a start-up signal 246 given when starting the system.

In the first step, according to "1" of the control signal 228 outputted from the sequencer circuit 244, the switch circuit 233 is switched to the side transmitting the output of the comparator circuit 232 to the variable voltage circuit 234 side. At the same time, according to "1" of the control signal 228, the switch circuit 242 is switched to the side blocking the bias current $I_{124}$ to the clock signal frequency multiplier circuit 106. The switch circuit 243 is switched to the side transmitting the master clock signal 217 to the clock signal frequency multiplier circuit 106. The initial value of an output data signal 215 of the up counter circuit 237 constructing the variable voltage source 234 is set to 0. Thereby, the voltage of the D/A converter circuit 238, that is, the initial value of the reference voltage 211 is 0. The initial value of an output data signal 216 of the down counter circuit 239 constructing the variable bias current source 236 is set to supply the bias current $I_{124}$ 30% higher than a value to be converged to the SFQ clock signal frequency multiplier circuit 106.

The bias current $I_{124}$ to the clock signal frequency multiplier circuit 106 is blocked. The JTLs in the ladder-type clock signal generating circuit 201 lose the propagation function of the SFQ pulse. The SFQ pulse 125 is not generated from the clock signal frequency multiplier circuit 106. The master clock signal 217 inputted to the clock signal frequency multiplier circuit 106, as shown in FIG. 4, is added via the SFQ generating circuit 208 and the frequency divider circuit 206 to the single flux quantum (SFQ) to dc converter circuit 207, and is outputted as the evaluation signal 210 having a duty ratio of 50%. From the evaluation signal 210, only a dc voltage signal 212 is fetched by the low-pass filter circuit 231. The duty ratio of the evaluation signal 210 is converted to the magnitude of the dc voltage. The comparator circuit 232 compares the dc voltage signal 212 with the reference voltage 211. The comparator circuit 232 outputs "1" as a digital signal 213 when the voltage of the dc voltage signal 212 is larger than the reference voltage 211 and outputs "0" other than that. The comparison result is inputted via the switch circuit 233 to the up counter circuit 237 of the variable voltage source 234 and an inverter gate circuit 245.

The up counter circuit 237 continuously increases the value of the output data 215 while the input signal is "1". Along with it, the output voltage (the reference voltage 211) of the D/A converter circuit $238_1$ is increased. At the instant in which the reference voltage 211 exceeds the voltage of the dc voltage signal 212, the output digital signal 213 of the comparator circuit 232 is "0" to stop increasing the value of the up counter circuit 237. At this point, the reference voltage 211 is fixed, and the reference voltage 211 is set to the dc voltage when the duty ratio of the evaluation signal 210 is 50%. When the output digital signal 213 of the comparator circuit 232 is changed from "1" to "0", an output signal 226 of the inverter gate circuit 245 is changed from "0" to "1". The change is a trigger for moving the circuit operation of the sequencer circuit 244 to the second step.

In the second step, the control signal 228 outputted from the sequencer circuit 244 is switched from "1" to "0". By "0" of the control signal 228, the switch circuit 233 is switched to the side transmitting the output digital signal 213 of the comparator circuit 232 to the variable current circuit 236 side. The switch circuit 242 transmits the bias current 1124 outputted by the variable current source 236 to the clock signal frequency multiplier circuit 106. The switch circuit 243 blocks the master clock signal 217. Immediately after moving to the second step, the high bias current $I_{124}$ is supplied to the SFQ clock signal frequency multiplier circuit 106. The interval between the SFQ pulses 125 generated is shorter than the value to be converged. The initial value of the duty ratio of the evaluation output 210 is not 50%. This state is shown as the evaluation output 210 (initial state) in FIG. 5. The situation of the case that the initial value of the duty ratio of the evaluation output 210 is not 50% is changed depending on the initial state of the single flux quantum (SFQ) to dc converter circuit 207. That is, as in two states shown in FIG. 5, there are the case that the duty ratio is lower than 50% and the case that the duty ratio is higher than 50%.

When the duty ratio of the evaluation signal 210 is lower than 50%, the initial value of the dc voltage signal 212 is smaller than the reference voltage 211 decided in the first step and the comparator circuit 232 outputs "0" as the digital signal 213. The digital signal 213 is inputted via the switch circuit 233 to the exclusive NOR gate circuit 241 and the latch circuit 235. The sequencer circuit 244 outputs the trigger signal 229 to the latch circuit 235 after a predetermined time of reception of the output signal 226 of the inverter gate circuit 245. Output terminal Q of the latch circuit 235 has an initial output of "0", and when the trigger signal 229 is inputted, outputs a signal corresponding to the signal of input terminal D.

Immediately after moving to the second step, the digital signal 213 of the comparator circuit 232 is "0" and the output of the output terminal Q of the latch circuit 235 is "0". The exclusive NOR gate circuit 241 outputs "1". "1" is inputted as the digital signal 227 to the counter circuit 239 to decrease the value of the output data signal 216, and consequently, the bias current $I_{124}$ is reduced. Reduction in the bias current $I_{124}$ increases the propagation time of the SFQ pulse on the JTLs in the ladder-type clock signal generating circuit 201. The pulse interval between the SFQ pulses 125 outputted from the ladder-type clock signal generating circuit 201 is increased so that the duty ratio of the evaluation output 210 is higher. When the duty ratio exceeds 50%, the dc voltage signal 212 exceeds the reference voltage 211, and the comparator circuit 232 outputs "1" as the digital signal 213. As a result, the inputs of the exclusive NOR gate circuit 241 are "1" and "0". "0" is inputted as the digital signal 227 to the down counter circuit 239. The down counter circuit 239 stops decreasing the value of the output data signal 216 to fix the bias current 1124. In the process of the operation, the trigger signal 229 is inputted to the latch circuit 235. Timing at which the trigger signal 229 is outputted may be before the duty ratio is 50% while the duty ratio of the evaluation output 210 is increased. Since the input terminal D is "0", the output Q of the latch circuit 235 maintains "0", resulting in no trouble in the operation deciding the bias current $I_{124}$.

When the duty ratio of the evaluation signal 210 is higher than 50%, the initial value of the dc voltage signal 212 is larger than the reference voltage 211 decided in the first step. The comparator circuit 232 outputs "1" as the digital signal 213. In this case, the initial output of the latch circuit 235 is "0". Since the inputs of the exclusive NOR gate circuit 241 are "1" and "0", the exclusive NOR gate circuit 241 outputs "0" as the digital signal 227. In this case, the down counter circuit 239 does not start the operation decreasing the value of the output signal 216. When the trigger signal 229 is outputted, the input D of the latch circuit 235 is "1" and the output Q is "1". As a result, the exclusive NOR gate circuit 241 outputs "1" as the digital signal 227 to reduce the bias current $I_{124}$. Reduction in the bias current $I_{124}$ increases the pulse interval between the SFQ pulses 125 outputted from the ladder-type clock signal generating circuit 201 so that the duty ratio of evaluation output 210 is lower. When the duty ratio of the evaluation output 210 is 50%, the comparator circuit 232 outputs "0" as the digital signal 213. The exclusive NOR gate circuit 241 outputs "0" as the digital signal 217. In this step, the operation reducing the bias current 214 is stopped to fix the bias current $I_{124}$.

Based on the evaluation output 210, feedback control is performed to the variable bias current source 236 to maintain the duty ratio of the evaluation signal 210 at 50% to automatically make the cycle of the SFQ internal clock signal 125 uniform.

In the first step of setting the reference voltage 211 inputted to the comparator circuit 232 of the operation of the control circuit 230, the master clock signal 217 is used to obtain the evaluation signal 210 having a duty ratio of 50%. At this time, the master clock signal 217 is added via the SFQ generating circuit 208 and the frequency divider circuit 206 to the single flux quantum (SFQ) to dc converter circuit 207 for generating the evaluation signal 210 having a duty ratio of 50%. Any signal whose cycle is not fluctuated may be used as the master clock signal 217 itself. It is convenient to use the master clock signal 123 obtained in the system in which its cycle is not fluctuated. In FIGS. 4 and 6, for convenience of the description, the master clock signal 217 is used, which may be expressed as the master clock signal 123.

(Demultiplexing Circuit)

Figure 7:
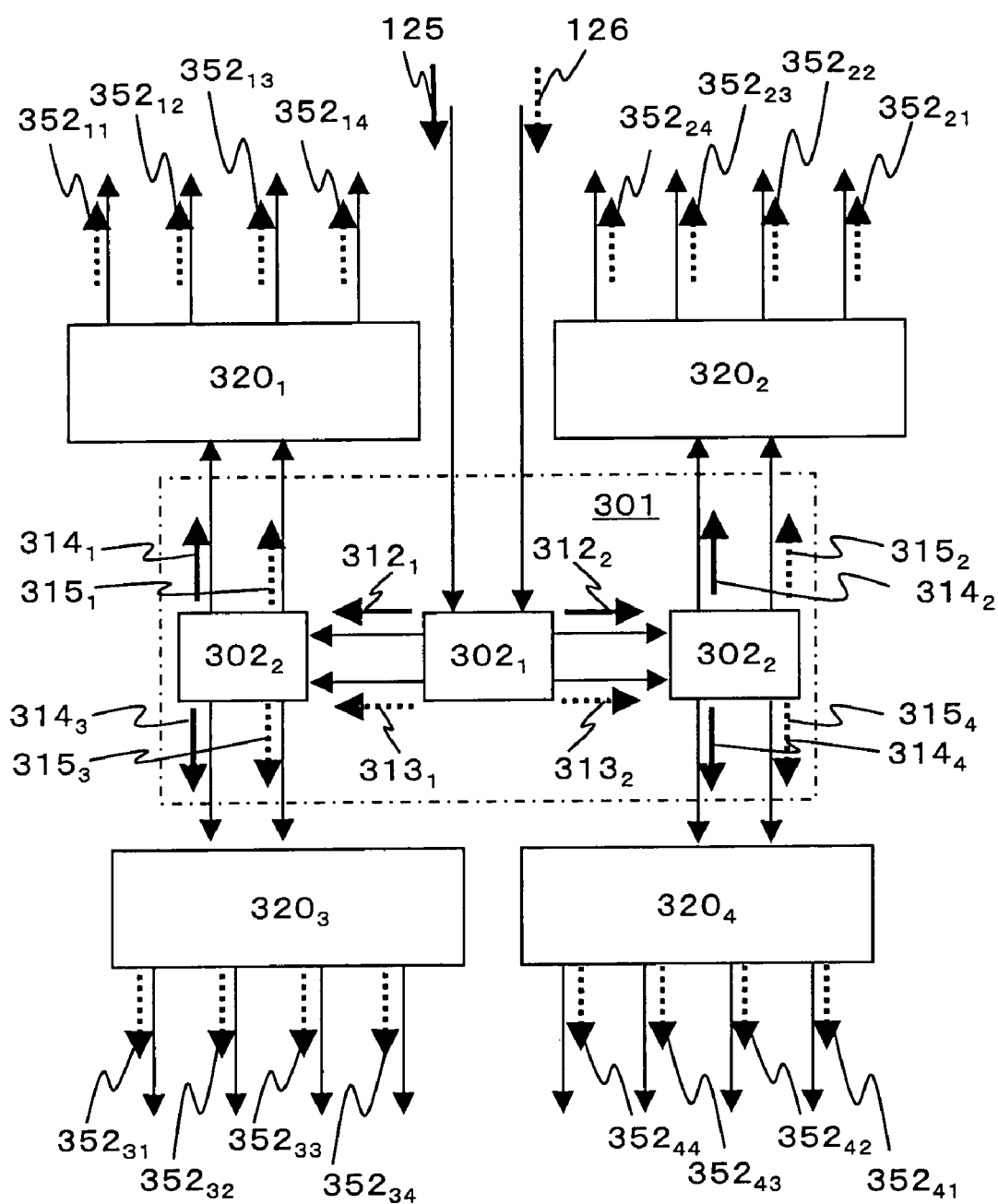
FIG. 7 is a block diagram of a demultiplexing circuit 108 of the A/D converter shown in FIG. 1.

FIG. 7 is a block diagram of the demultiplexing circuit 108 of the A/D converter shown in FIG. 1. The demultiplexing circuit 108 has a 1-to-M binary-tree type demultiplexing circuit 301 receiving, as inputs, the SFQ clock signal 125 outputted from the clock signal frequency multiplier circuit 106 and the SFQ data signal 126 obtained by oversampling by the modulator circuit 107, and M sets of N-bit shift-dump type demultiplexing circuits 320 receiving, as inputs, an SFQ clock signal 314 and an SFQ data signal 315 outputted from the binary-tree type demultiplexing circuit 301. This example shows the case that M=4 and N=4. When being required in the description of the operation of the embodiment, the circuits and signals will be identified by numerical subscripts given to the reference numerals.

Figure 8:
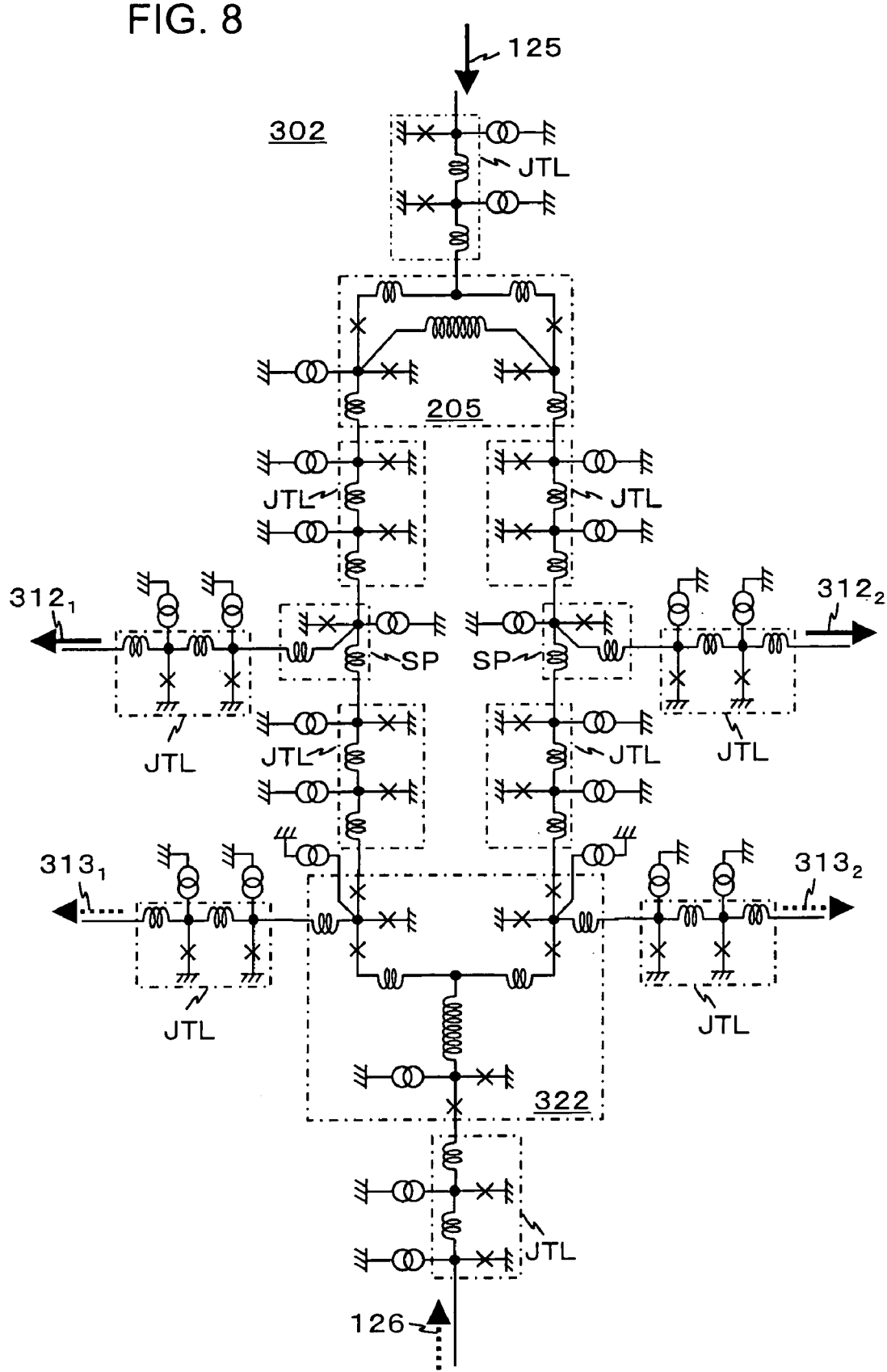
FIG. 8 is a diagram showing an equivalent circuit of a 1-to-2 demultiplexing circuit 302 of the A/D converter shown in FIG. 1.

The binary-tree type demultiplexing circuit 301 is constructed by connecting 1-to-2 demultiplexing circuits 302 as minimum components in a tree form. FIG. 8 is a diagram showing an equivalent circuit of the 1-to-2 demultiplexing circuit 302. The circuit has the T-FF circuit 205 and a 1-to-2 switch circuit 322. The SFQ clock signal 125 inputted to the 1-to-2 demultiplexing circuit 302 is alternately demultiplexed as two SFQ clock signals $312_1$, $312_2$ by the T-FF circuit 205. The demultiplexed SFQ clock signal controls the output direction of the 1-to-2 switch circuit 322. The SFQ data signal 126 inputted to the 1-to-2 switch circuit 322 is demultiplexed as two SFQ data signals $313_1$, $313_2$ corresponding to the two SFQ clock signals $312_1$, $312_2$. The equivalent circuit of the 1-to-2 demultiplexing circuit 302 shown in FIG. 8 which is specifically disclosed in FIG. 7 of Patent Document 1 can be used.

A pair of the SFQ clock signal $312_1$ and the SFQ data signal $313_1$, and a pair of the SFQ clock signal $312_2$ and the SFQ data signal $313_2$ demultiplexed by the 1-to-2 demultiplexing circuit $302_1$ in the first stage can be directly inputted to the 1-to-2 demultiplexing circuits $302_2$ in the second stage. The two 1-to-2 demultiplexing circuits $302_2$ in the second stage output the SFQ clock signals 314 and the SFQ data signals 315 demultiplexed to four channels.

The demultiplexed SFQ data signals $315_1, \ldots, 315_4$ and the demultiplexed SFQ clock signals $314_1, \ldots, 314_4$ are inputted in pairs to the shift-dump type demultiplexing circuits $320_1, \ldots, 320_4$.

Figure 9:
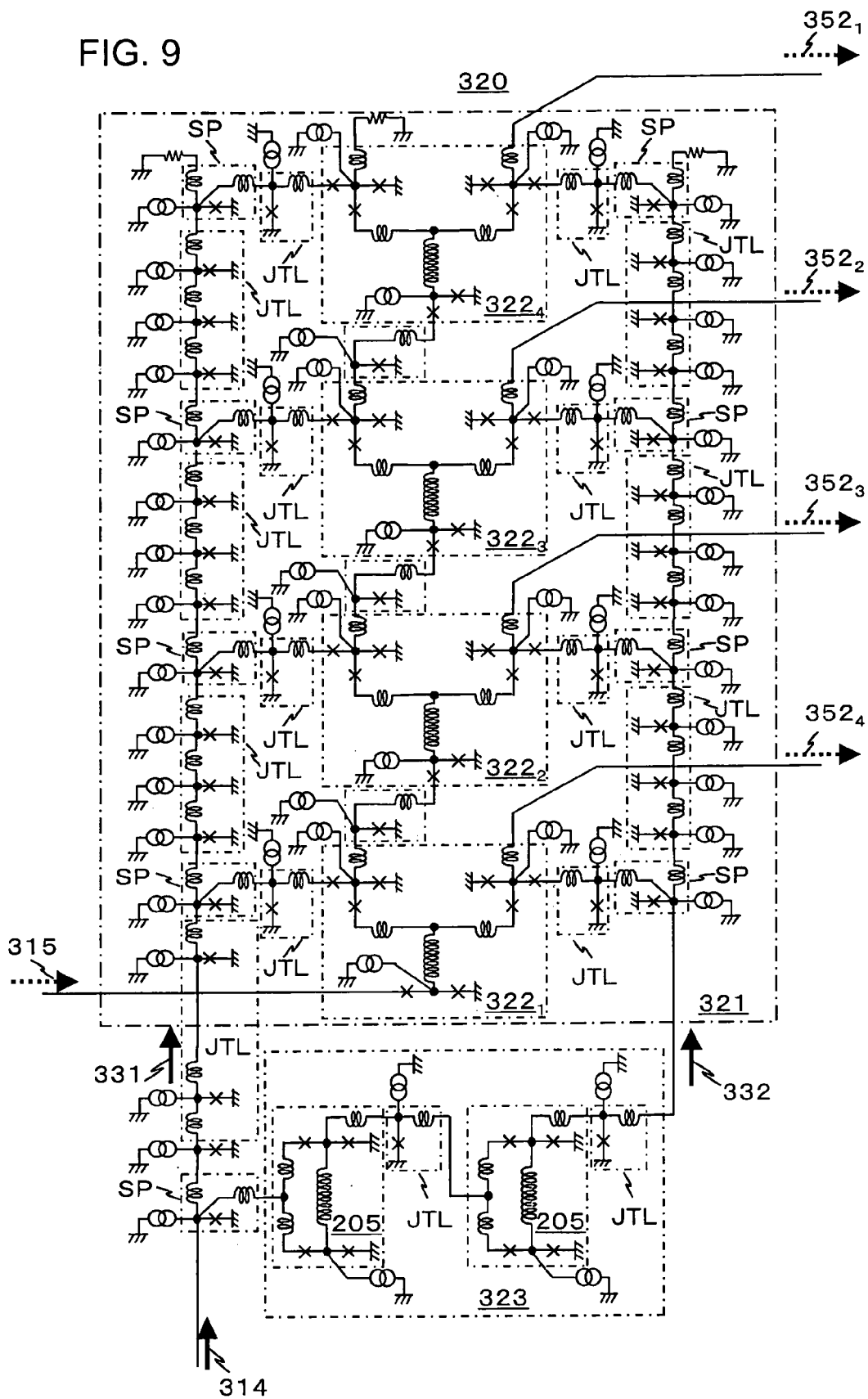
FIG. 9 is a diagram showing an equivalent circuit of a shift-dump type demultiplexing circuit 320 of the A/D converter shown in FIG. 1.

FIG. 9 is a diagram showing an equivalent circuit of the shift-dump type demultiplexing circuit 320. The circuit has a shift-dump register circuit 321 having the four 1-to-2 switch circuits $322_1, 322_2, 322_3$ and $322_4$ cascade connected, and a clock controller circuit 323 having the T-FF circuits 205. Along with the input of the SFQ clock signal 314, an SFQ shift clock signal 331 is supplied via the JTL to the shift-dump register circuit 321. According to the shift clock signal 331, the shift-dump register circuit 321 stores the inputted SFQ data signals 315 while sequentially shifting them. That is, the first coming SFQ data signal 315 is stored in a loop inductor of the 1-to-2 switch circuit $322_1$, and according to the later coming SFQ shift clock signal 331, the SFQ data signal stored in the loop inductor of the 1-to-2 switch circuit $322_1$ is stored in a loop inductor of the 1-to-2 switch circuit $322_2$, and the next SFQ data signal 315 is stored in the loop inductor of the 1-to-2 switch circuit $322_1$.

This is alike when there is not the SFQ data signal 315 to be stored. The coming SFQ data signals 315 are stored while being sequentially shifted. The clock controller circuit 323 counts the SFQ clock signals 314. When the number of shifts (the number of comings of the SFQ clock signals 314) reaches three and the next clock signal 314 is inputted, the clock controller circuit 323 outputs an SFQ release clock signal 332. In synchronization with the SFQ release clock signal 332, all the four SFQ data signals stored in the loop inductors of the 1-to-2 switch circuits $322_1$, $322_2$, $322_3$ and $322_4$ are outputted as demultiplexed SFQ data signals 352 at the same time. Here, the number of the JTL stages is selected so that the SFQ release clock signal 332 is added to the shift-dump register circuit 321 prior to the SFQ shift clock signal 331. The entire demultiplexing circuit 108 has the four shift-dump type demultiplexing circuits 320. Finally, the SFQ data signals 126 are demultiplexed into 16 output channels.

A first feature of the demultiplexing circuit 108 is suitable for the high-speed operation as in the binary-tree type demultiplexing circuit 301. The binary-tree type demultiplexing circuit 301 on the input side performs high-speed demultiplexing of the SFQ data signal. In the stage in which the SFQ data signal is transmitted to the shift-dump type demultiplexing circuit 320, the frequency is ¼. The shift-dump type demultiplexing circuit 320 can be operated at a lower frequency with a smaller number of output channels. In a second feature, the output timings from the shift-dump type demultiplexing circuits 320 are equal. The allowance (timing margin) of timing design necessary for the synchronous operation of the demultiplexing circuit and the later-stage circuit can be increased.

Figure 10:
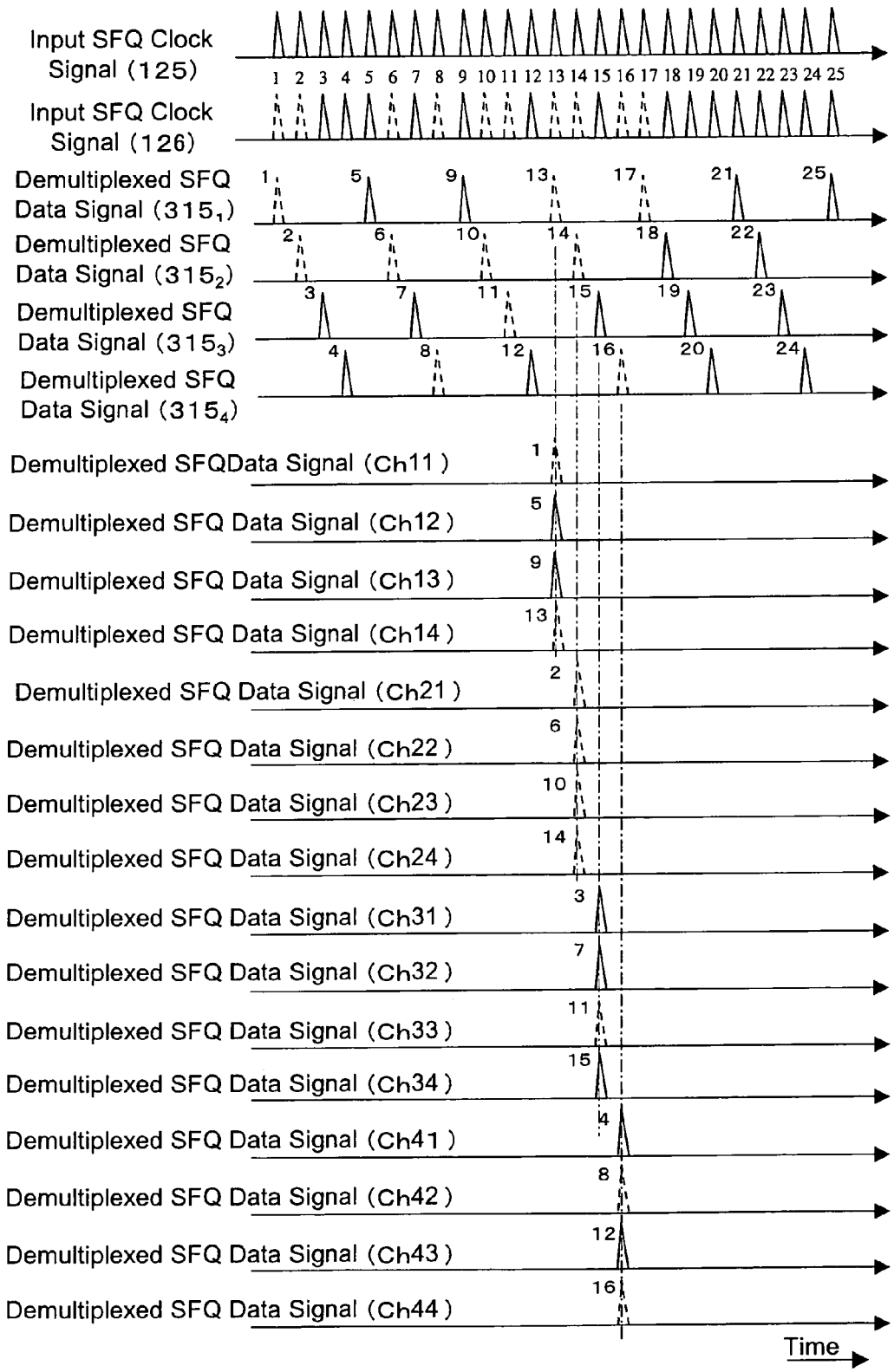
FIG. 10 is a diagram showing the output timings of demultiplexed SFQ data signals of the A/D converter shown in FIG. 1.

FIG. 10 is a diagram showing the output timings of the demultiplexed SFQ data signals. The numbers given to the input SFQ data signals denote the correspondence of them with the demultiplexed SFQ data signals. The input SFQ data signals 126 are the same as those shown in FIG. 2. In order that the data signal handled in time-series is easily understood, the demultiplexed SFQ data signals 126 not existing in FIG. 2 are indicated by the dashed lines. The channel number of the demultiplexed SFQ data signals corresponds to the channel number of the demultiplexed outputs shown in FIG. 7. The output timings of the demultiplexed data signals "$315_1, \ldots, 315_4$" from the binary-tree type demultiplexing circuit 301 are different for each channel. The shift-dump type demultiplexing circuit 320 in the later stage outputs the SFQ data signals at a time when four data are stored and are complete. The final demultiplexed SFQ data signals are outputted by four data in 4 clock cycles (from the 13th to the 16th clocks). Time interval from output of all the demultiplexed SFQ data signals to output of the next demultiplexed SFQ data signal corresponds to 12 cycles of the SFQ clock signal 125. To realize the synchronous operation of the demultiplexing circuit 108 and the later-stage circuit, the later-stage circuit must load the demultiplexed SFQ data signals in the period in which no demultiplexed data is outputted. The period is a time interval 12 times longer than a system having only the binary-tree type demultiplexing circuit. The timing margin for the synchronization can be increased 12 times.

In general, when timing margin $T_{LT}$ is expressed by M, N, equation (3) is given.

$$T_{LT}[ps] = M \cdot (N-1) T_{CLK}[ps] \quad (3)$$

The cycle of the input SFQ clock signal 125 is $T_{CLK}$.
The conditions of the number of channels M, N for realizing high-speed demultiplexing of the data signal will be considered here. The rate of the data signal demultiplexed from the binary-tree type demultiplexing circuit 301 must be lower than the maximum operation frequency of the shift-dump type demultiplexing circuit 320. The number of output channels M of the binary-tree type demultiplexing circuit 301 must meet equation (4) when the frequency of the input clock signal is $f_{CLK}$ and the maximum operation frequency of the shift-dump type demultiplexing circuit 320 is $f_{SDMAX}$.

$$M > \frac{f_{CLK}}{f_{SDMAX}} \text{[channels]} \quad (4)$$

When the minimum timing margin to be secured of the final demultiplexed data signal is $T_{LTMIN}$, for the number of output channels N of the shift-dump type demultiplexing circuit 320, relation equation (5) can be obtained from the equations (3) and (4).

$$N > \frac{f_{CLK} \cdot T_{LTMIN}}{M+1} \text{[channels]} \quad (5)$$

(Memory Circuit and Superconducting Amplifier Circuit)

Figure 11:
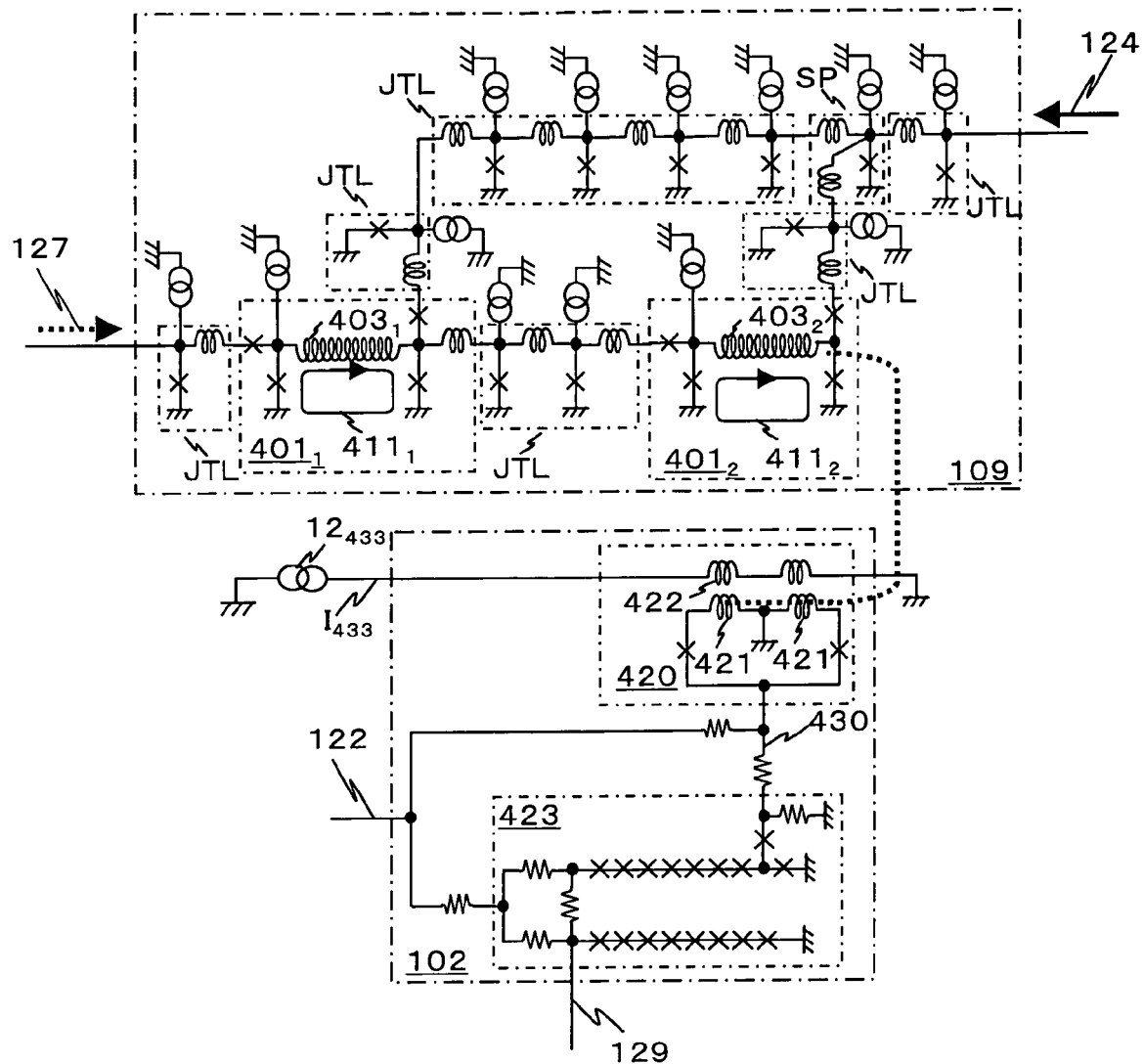
FIG. 11 is a diagram showing an equivalent circuit of a memory circuit 109 and a superconducting amplifier circuit 102 as the components of an SFQ front-end circuit 101 of the A/D converter shown in FIG. 1.
Figure 12:
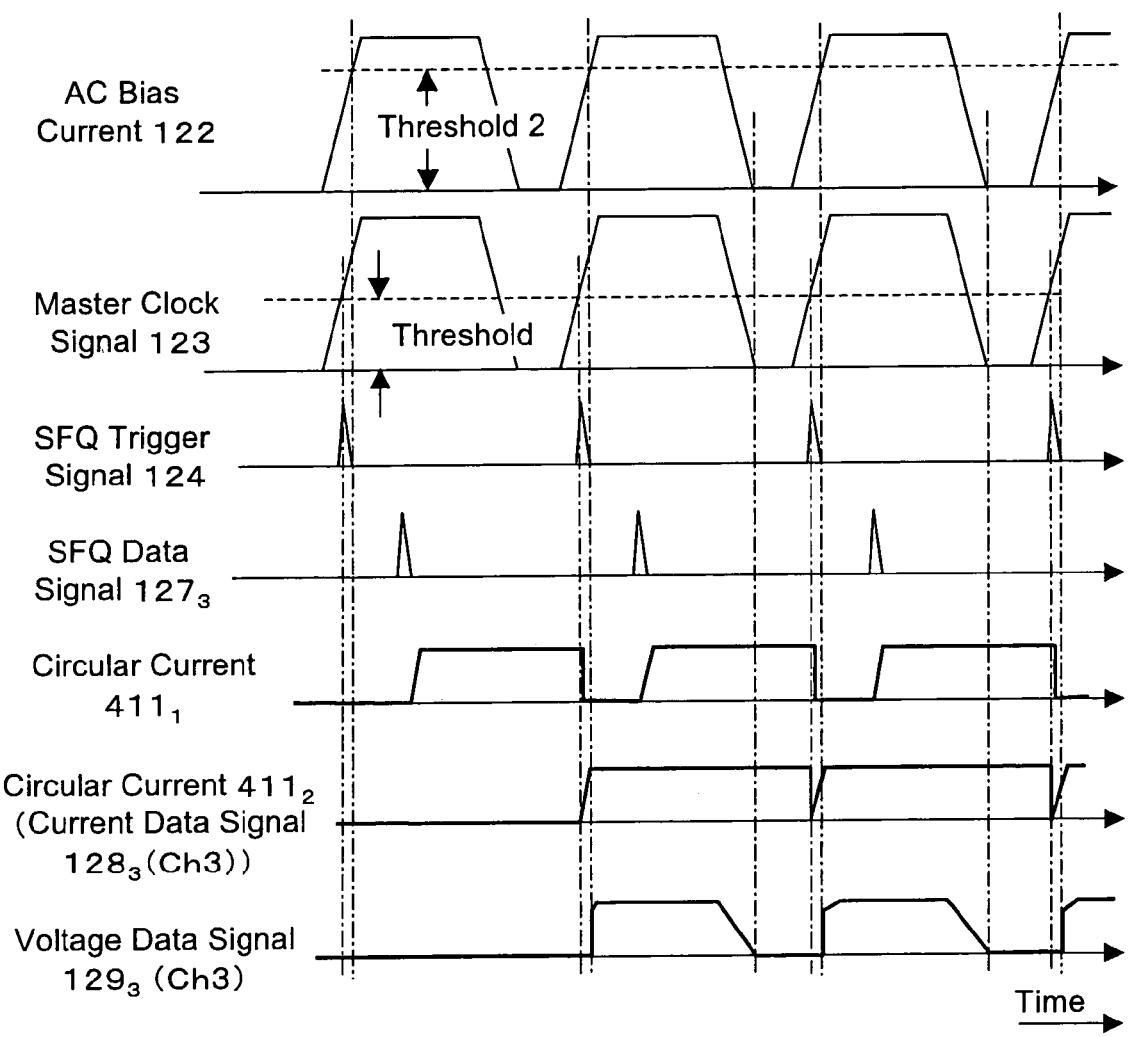
FIG. 12 is a diagram showing an operation time chart of the circuits of FIG. 11.

FIG. 11 is a diagram showing an equivalent circuit of the memory circuit 109 as the components of the SFQ front-end circuit 101 and the superconducting amplifier circuit 102. FIG. 12 is a diagram showing an operation time chart of the circuits.

The memory circuit 109 once holds the SFQ data signal 127 demultiplexed from the demultiplexing circuit 108 to output the current data signal 128 synchronized with the operation of the superconducting amplifier circuit 102 as its later-stage circuit. The memory circuit 109 has a shift register having two data flip-flop circuits $401_1$, $401_2$ cascade connected. The SFQ data signal 127 and the SFQ trigger signal 124 are inputted to the memory circuit 109. The SFQ trigger signal 124 is inputted via the series-connected JTLs to be supplied to the first data flip-flop circuit $401_2$, and is then supplied to the second data flip-flop circuit $401_1$ with delay. The inputted SFQ data signal 127 is stored in a loop inductor $403_1$ of the first data flip-flop circuit $401_1$ to flow a circular current $411_1$. The SFQ trigger signal 124 successively supplied moves the SFQ data signal 127 stored in the loop inductor $403_1$ of the first data flip-flop circuit $401_1$ to the loop inductor $403_2$ of the second data flip-flop circuit $401_2$ to be stored to flow a circular current $411_2$. When there is the newly-inputted SFQ data signal 127, this is stored in the loop inductor $403_1$ of the first data flip-flop circuit $401_1$ to flow the circular current $411_1$. The SFQ trigger signal 124 supplied lets the SFQ data signal 127 stored as the circular current $411_2$ in the loop inductor $403_2$ of the second data flip-flop circuit $401_2$ disappear. When the SFQ data signal 127 is newly stored in the loop inductor $403_1$ of the first data flip-flop circuit $401_1$, this is stored as the new SFQ data signal 127 in the loop inductor $403_2$ of the second data flip-flop circuit $401_2$ to flow the circular current $411_2$. In the period in which the SFQ data signal 127 is stored in the loop inductor $403_2$ of the second data flip-flop circuit $401_2$, the circular current $411_2$ continues to flow.

FIG. 12 shows a time chart about signals of the memory circuit 109 by focusing on the SFQ data signal $127_3$ shown in FIG. 2. The AC bias current 122, the master clock signal 123, the SFQ data signal 127 and the SFQ trigger signal 124 are the same as those of FIG. 2. As described above, the first SFQ data signal 127 appearing flows the circular current $411_1$ to the loop inductor $403_1$ of the first data flip-flop circuit $401_1$. The SFQ trigger signal 124 appearing later moves the SFQ data signal 127 to the loop inductor $403_2$ of the second flip-flop circuit $401_2$ to flow the circular current $411_2$. At this time, the circular current $411_1$ of the loop inductor $403_1$ of the first data flip-flop circuit $401_1$ disappears. The SFQ data signal $127_3$ appearing next flows again the circular current $411_1$ of the loop inductor $403_1$ of the first data flip-flop circuit $401_1$. This is moved to the loop inductor $403_2$ of the second data flip-flop circuit $401_2$ by the SFQ trigger signal 124 appearing next to flow the circular current $411_2$.

Although not shown, as understood with reference to FIG. 2, the generation points of the SFQ data signal $127_1$ and the SFQ data signal $127_3$ are different. As a result, the generation points of the circular current $411_1$ generated by the SFQ data signal 127 are different in the channels. Nevertheless the circular current $411_2$ starts flowing by the SFQ trigger signal 124 appearing later. The period the circular current $411_2$ flowing is one cycle of the master clock signal 123 without depending on time at which the SFQ data signal 127 reaches the memory circuit 109 (regardless of the channel).

The construction of the memory circuit 109 is very applicable to connect to the later-stage circuit. Irrespective of the output timing of the SFQ data signal 127 from the demultiplexing circuit 108, the circular current 411 is obtained in synchronization with only the master clock signal 123 after the SFQ data signal 127 appears. The later-stage circuit may be synchronized with only the master clock signal 123. The SFQ data signal 127 as a voltage pulse of several ps is converted to the clock cycle similar to the master clock signal 123 as the circular current 411, that is, a current level signal having a pulse width of about 100 ps, facilitating signal transmission to the semiconductor circuit.

The state that the circular current $411_2$ flowing indicates that the current data signal 128 shown in FIG. 2 appears. The current data signal 128 from the memory circuit 109 is transmitted to the superconducting amplifier circuit 102 shown in FIG. 1. The superconducting amplifier circuit 102 detects the circular current $411_2$ to obtain the voltage data signal 129 shown in FIG. 2. The voltage data signal 129 from the superconducting amplifier circuit 102 is transmitted to the semiconductor back-end circuit 104 shown in FIG. 1.

Detection of the circular current $411_2$ by the superconducting amplifier circuit 102 will be described by returning to FIG. 11. The superconducting amplifier circuit 102 has a superconducting quantum interference device (SQUID) 420 detecting the circular current $411_2$, and a stack type amplifier circuit 423 amplifying the voltage signal of the SQUID 420.

The loop inductor $403_2$ of the memory circuit 109 is magnetically coupled to magnetic field detecting coils 421 of the SQUID 420. FIG. 11 shows the magnetic coupling by the thick dotted line. The SQUID 420 converts the presence or absence of the circular current $411_2$ of the memory circuit 109 to the presence or absence of a voltage signal 430. The sensitivity of SQUID 420 is determined by the bias current flowing from $I_{433}$ the bias current source $12_{433}$ to a bias coil 422. The stack type amplifier circuit 423 is connected to the SQUID 420 to amplify the voltage signal 430 of the SQUID 420 for outputting a voltage of tens of mV as the voltage data signal 129. An AC-biased latching circuit is used as the SQUID 420 and the stack type amplifier circuit 423. The power supplies to these latching circuits are the AC bias current 122. The AC-biased latching circuit can obtain a high voltage output.

When the circular current $411_2$ does not flow to the loop inductor $403_2$ of the memory circuit 109, no magnetic field is supplied to the magnetic field detecting coils 421 of the SQUID 420. The output voltage of the SQUID is 0 irrespective of the magnitude of the AC bias current 122 supplied to the SQUID. When the circular current $411_2$ flows to the loop inductor $403_2$ of the memory circuit 109, the magnetic field generated by the circular current $411_2$ is coupled with the coils 421 of the SQUID 420. In this state, when the AC bias current 122 supplied to the SQUID 420 exceeds a threshold (expressed as a threshold 2 in FIG. 12 to identify the threshold of the SFQ generating circuit 105), the output of the SQUID 420 is brought into the voltage state. The voltage data signal 430 is transmitted to the stack type amplifier circuit 423. When a voltage data signals 430 is applied to the input of the stack type amplifier circuit 423 and the AC bias current 122 supplied to the stack type amplifier circuit exceeds the threshold 2, the voltage data signal 129 is outputted. The voltage level of the data signal 129 depends on the magnitude of the AC bias current 122 supplied and is tens of mV at the peak of the AC bias current 122. In order that the stack type amplifier circuit 423 receives the voltage data signal 430 from the SQUID 420 to quickly output the voltage data signal 129, the timing at which the SQUID 420 starts transiting the voltage state and the timing at which the stack type amplifier circuit 423 starts transiting the voltage state are equal. The timing calibration on the SQUID side can be realized by calibrating the dc bias current $I_{433}$. When the AC bias current 122 supplied to the SQUID 420 and the stack type amplifier circuit 423 is 0, the outputs of the SQUID 420 and the stack type amplifier circuit 423 are returned to be in the zero-voltage state. The period the superconducting amplifier circuit is in the voltage state is that the AC bias current is 0 from timing at which the SQUID 420 and the stack type amplifier circuit 423 start transiting the voltage state.

(Embodiment 2)

Figure 13:
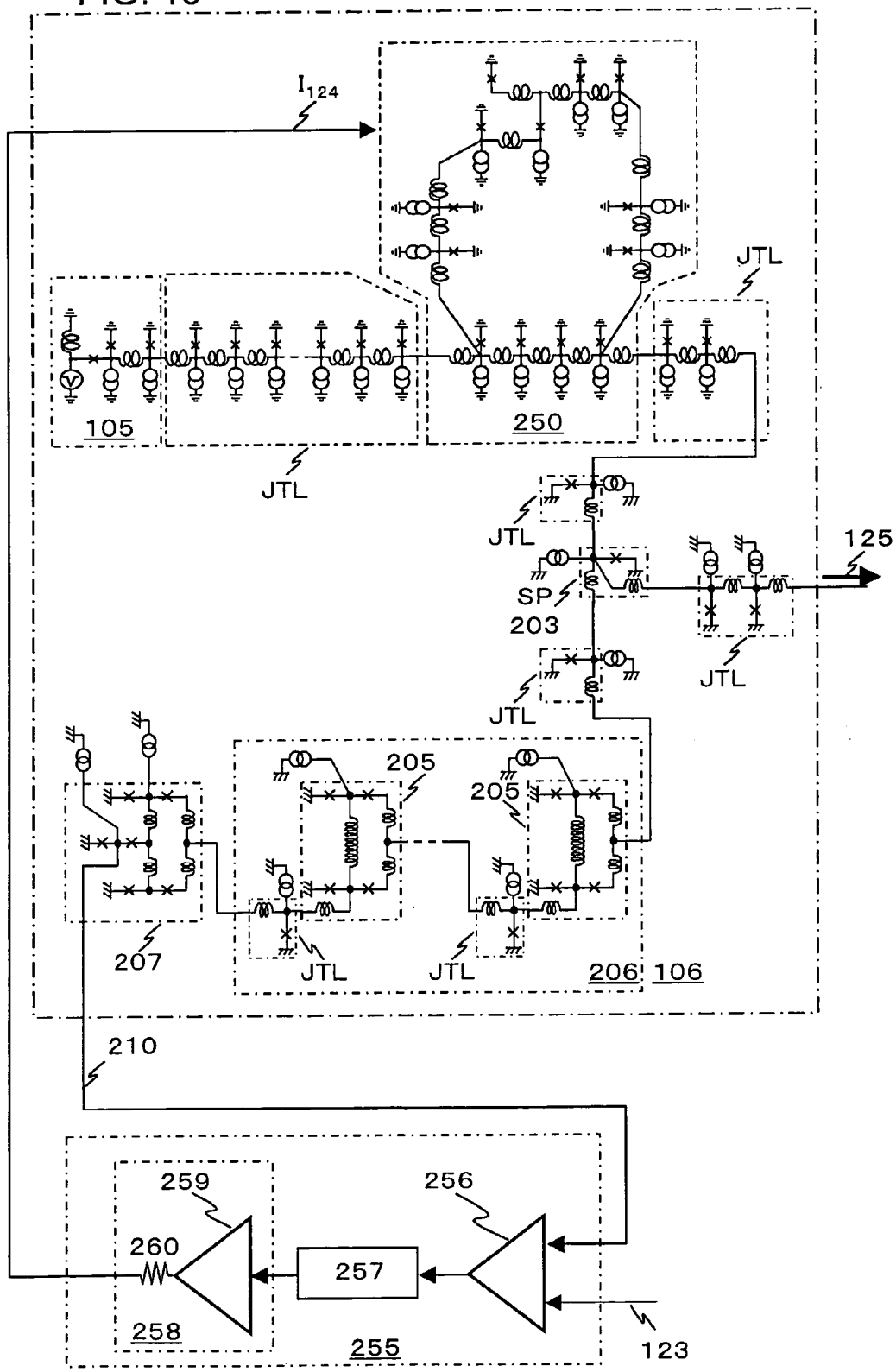
FIG. 13 is a block diagram, as Embodiment 2, showing a circuit construction when using a ring oscillator circuit 250 for the clock signal frequency multiplier circuit 106.

FIG. 13 is a block diagram showing, as Embodiment 2, a circuit construction when using the ring oscillator circuit 250 for the clock signal frequency multiplier circuit 106. A specific example of the ring oscillator circuit 250 is proposed in FIG. 5 of Patent Document 2. The bias current $I_{124}$ supplied to the ring oscillator circuit 250, as in the $2^N$-bit ladder-type clock signal generating circuit 201 described in FIG. 4, is connected to the junctions of all bias current sources shown in the ring oscillator circuit 250 via the bias resistance. Here, for simplifying the drawing, the bias current $I_{124}$ is introduced by the arrow. When one SFQ signal is generated by the SFQ generating circuit 105 to be inputted to the ring oscillator circuit 250, the SFQ signal is circulated on the JTL arranged in the ring form to generate an infinite number of SFQ pulse trains from the SP at any point. The pulse train is used as the SFQ internal clock signal 125. The construction of FIG. 13 is similar to that shown in FIG. 4. In the construction of FIG. 13, the master clock signal 217 necessary in FIG. 4 is unnecessary.

In order that the SFQ internal clock signal 125 generated by the ring oscillator circuit 250 is synchronized with the master clock signal 123, the pulse interval between the SFQ internal clock signals 125 must be calibrated to $T_{IN}/2^N$. Where the cycle of the master clock signal 123 is $T_{IN}$ and the frequency multiplier factor is $2^N$. The interval can be calibrated by the bias current $I_{124}$ supplied to the JTL. To compare the pulse interval between the SFQ pulses 125 with the cycle of the master clock signal 123, the $2^{N-1}$ frequency divider circuit 206 having the N-1 T-FFs 205 and the single flux quantum (SFQ) to dc converter circuit 207 are connected to the ring oscillator circuit 205. The evaluation signal 210 as the output of the single flux quantum (SFQ) to dc converter circuit 207 is transited between the fixed voltage state and the zero-voltage state each time $2^{N-1}$ SFQ pulses are generated by the ring oscillator circuit 250. The cycle of the voltage waveform of the evaluation signal 210 is measured to compare the pulse interval between the time-series pulses with the cycle of the master clock signal 123.

To synchronize the SFQ internal clock signal 125 with the master clock signal 123, the cycle of the evaluation signal 210 must be matched with the cycle of the master clock signal 123. To realize this matching, the construction of a control circuit 255 automatically calibrating the bias current $I_{124}$ is shown in the lower-stage part of FIG. 13. The control circuit 255 is constructed of a semiconductor circuit to perform control based on a phase locked loop. The evaluation signal 210 inputted to the control circuit 255 is compared its phase with the master clock signal 123 by a phase comparator circuit 256. The comparison result passes through a loop filter circuit 257 to be inputted to a variable bias current source 258 having a signal amplifier circuit 259 and the bias resistance 260.

In Embodiment 2, the voltage controlled oscillator circuit necessary for the construction of the phase locked loop has the variable bias current source 258 and the ring oscillator circuit 250. When the evaluation signal 210 is not synchronized with the master clock signal 123, the phase comparator circuit 256 detects the difference of the phase between both signals and controls the variable bias current source 258. The bias current $I_{124}$ is changed to calibrate the frequency of the ring oscillator circuit 250. As a result, the bias current value $I_{124}$ is converged at the point in which the phases of the evaluation signal 210 and the master clock signal 123 are matched with each other. The SFQ internal clock signal 125 in synchronization with the master clock signal 123 can be generated.

Embodiment 2 is the same as Embodiment 1 except that the clock signal frequency multiplier circuit 106 generating the SFQ internal clock signal 125 is different. The A/D converter can be constructed as in FIG. 1.

(Embodiment 3)

Figure 14:
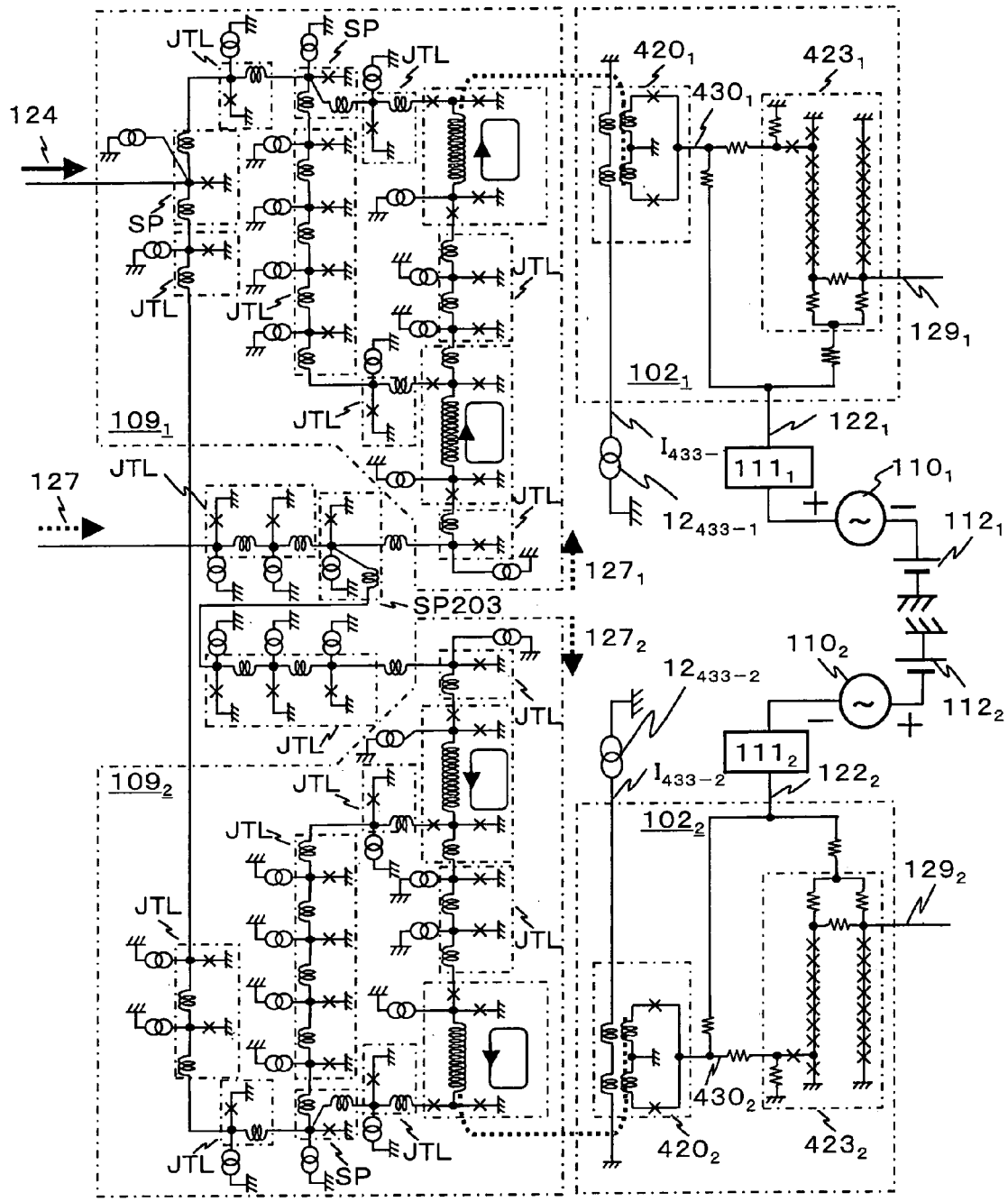
FIG. 14 is an equivalent circuit diagram, as Embodiment 3, showing the constructions of the memory circuit 109 and the superconducting amplifier circuit 102 devised to solve the problem of cross talk of an AC-biased latching circuit due to an AC bias current.
Figure 15:
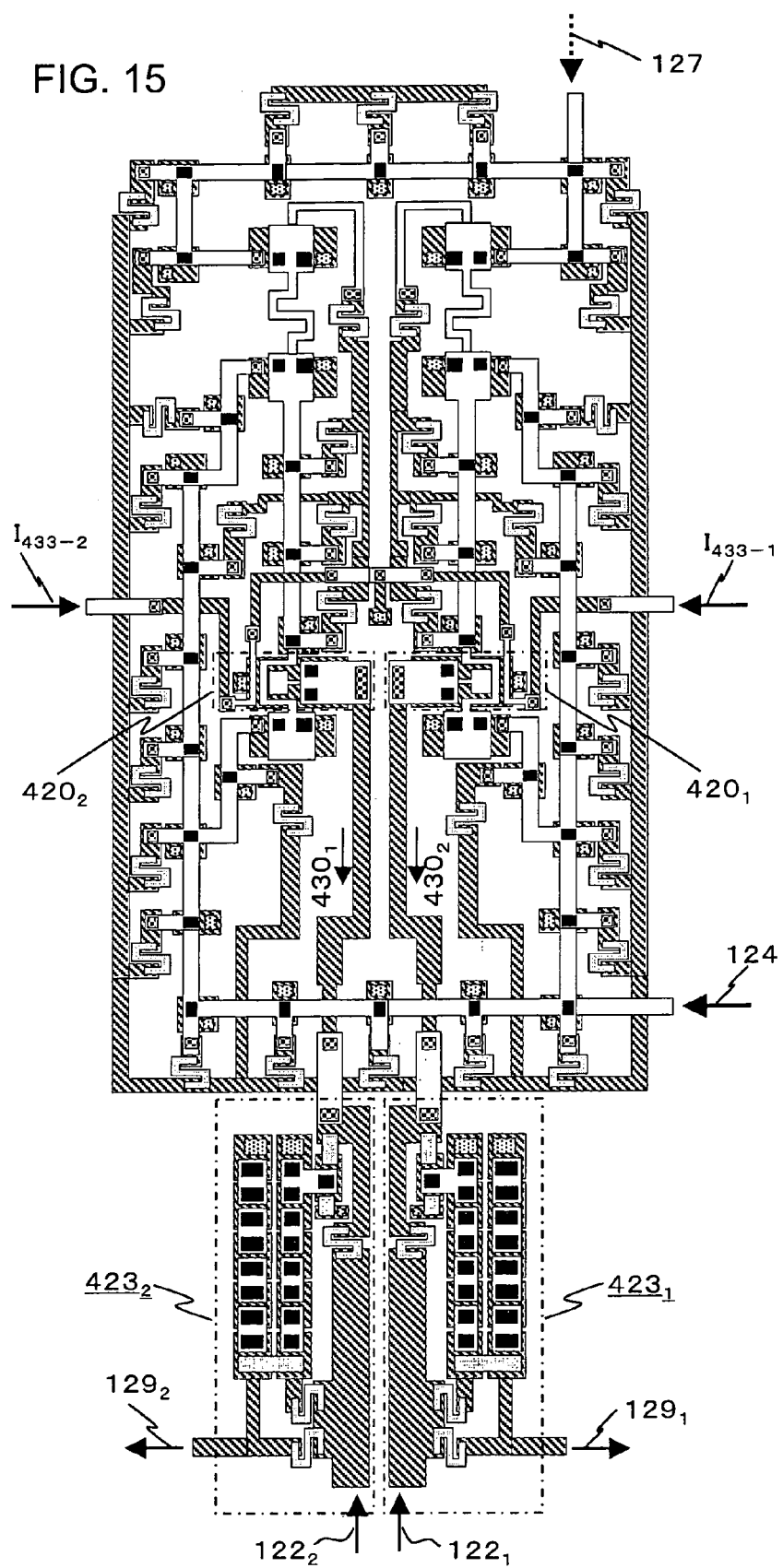
FIG. 15 is a diagram showing an example of the layout of the main part of the circuit shown in FIG. 14.

The memory circuit 109 and the superconducting amplifier circuit 102 of the AC-biased latching circuit described in FIG. 11 of Embodiment 1 can increase the output voltage. The AC bias current supplied to the latching circuit affects the operation of the SFQ circuit due to cross talk. FIG. 14 is an equivalent circuit diagram showing the constructions of the memory circuit 109 and the superconducting amplifier circuit 102 devised to solve-the problem of cross talk of the AC-biased latching circuit due to the AC bias current. FIG. 15 is a diagram showing an example of the layout of the main part of the circuits shown in FIG. 14. FIG. 16 is a diagram of assistance in explaining the component devices of FIG. 15.

As the circuit shown in FIG. 14 can be understood by comparison with FIG. 11, in the memory circuit 109 and the superconducting amplifier circuit 102 of Embodiment 3, a pair of the memory circuit 109$_1$ and the superconducting amplifier circuit 102$_1$ and a pair of the memory circuit 109$_2$ and the superconducting amplifier circuit 102$_2$ are arranged to be almost symmetric. The superconducting amplifier circuits 102$_1$ and 102$_2$ have a pair of the SQUID 420$_1$ and the stack type amplifier circuit 423$_1$ and a pair of the SQUID 420$_2$ and the stack type amplifier circuit 423$_2$. To the respective pairs of the SQUIDs 420 and the stack type amplifier circuits 423, as indicated by the polarities in the drawing, the AC bias currents 122$_1$ and 122$_2$ in opposite polarity are supplied. The lines supplying the AC bias currents 122$_1$ and 122$_2$ in opposite polarity are close to each other for layout, thereby canceling the AC component causing cross talk.

In an example of the layout shown in FIG. 15, the stack type amplifier circuits 423$_1$ and 423$_2$ are arranged in the lower-stage part to be symmetric with respect to a line, and the two lines flowing the two AC current biases 122$_1$ and 122$_2$ are arranged to be symmetric and to be close to each other. This can reduce the influence of cross talk.

In the superconducting amplifier circuit 102$_2$, the AC bias current 122$_2$ having negative polarity is supplied to the SQUID 420$_2$. The magnetic field detection characteristic of the SQUID 420 to the bias current is symmetric with respect to an origin point. It has substantially the same characteristic as that of the AC bias current whose polarity is positive. The polarity of the voltage data signal 430$_2$ of the SQUID 420$_2$ is also negative. There is no problem in the matching with the stack type amplifier circuit 423$_2$ driven by the AC bias current 122$_2$ whose polarity is negative. The polarity of the voltage data signal 129$_2$ from the stack type amplifier circuit 423$_2$ driven by the negative AC bias current 122$_2$ is negative. When the positive and negative AC bias currents 122 are supplied to the two identical superconducting amplifier circuits 102, the operations of the two superconducting amplifier circuits 102 are substantially the same, and only the polarities of the output voltages are different.

When the voltage data signal 129 is transmitted from the superconducting amplifier circuit 102 to the semiconductor circuit 104, the output voltage of the superconducting amplifier circuit 102 is desirably large. The polarities of the voltages outputted from the two superconducting amplifier circuits 102 to which the positive and negative AC bias currents are supplied are opposite to each other. This fact is used to double the output voltage. This will be described using the circuit of FIG. 14. To the two memory circuits 109$_1$ and 109$_2$, the same SFQ data signals 127$_1$, 127$_2$ are inputted via the splitter (SP) 203. The superconducting amplifier circuit 102$_1$ connected to the memory circuit 109$_1$ and the superconducting amplifier circuit 102$_2$ connected to the memory circuit 109$_2$ output the same voltage data signals 129$_1$ and 129$_2$. Since the AC bias currents 122$_1$ and 122$_2$ whose polarities are opposite to each other are supplied to the superconducting amplifier circuits 102$_1$ and 102$_2$, only the polarities of the output voltages 129$_1$ and 129$_2$ are opposite to each other. The effective output voltage is the defference between the two output voltages and is twice that obtained by one superconducting amplifier circuit.

As easily understood from the layout shown in FIG. 15, the pair of circuits can be arranged to be symmetric with respect to a line on the right and left sides, and the SFQ clock signal 124 cannot be introduced into the symmetric position. In consideration of this, the delay of SFQ pulse is considered so that the operations (the timings) of the pair of circuits are matched with each other as much as possible. In FIG. 14, the SFQ clock pulse 124 is split by the SP to be introduced as the SFQ clock pulses 124$_1$, 124$_2$, into the memory circuits 109$_1$ and 109$_2$, and the SFQ clock signal 124$_2$ is inputted by providing extra multi-JTL stages. To correspond to it, when introducing the SFQ data signal 127 into the memory circuits 109$_1$ and 109$_2$, the SFQ data signal 127$_2$ is inputted by providing extra multi-JTL stages.

The description of the detail of the correspondence of FIG. 15 showing the circuit layout with FIG. 14 showing the equivalent circuit is omitted. The components of the layout shown in FIG. 15 and the equivalent circuit corresponding to them are shown in FIGS. 16(A) and 16(B). The numeral 600 denotes a Josephson junction; the numeral 601, a base electrode; the numeral 602, a counter electrode; the numeral 603, grounding; the numeral 604, a contact between the counter electrode and the base electrode; and the numeral 605, a resistance. Comparing FIG. 14 with FIG. 15 based on the correspondence shown in FIG. 16, the correspondence between FIG. 14 and FIG. 15 can be easily understood.

(Embodiment 4)

Figure 17:
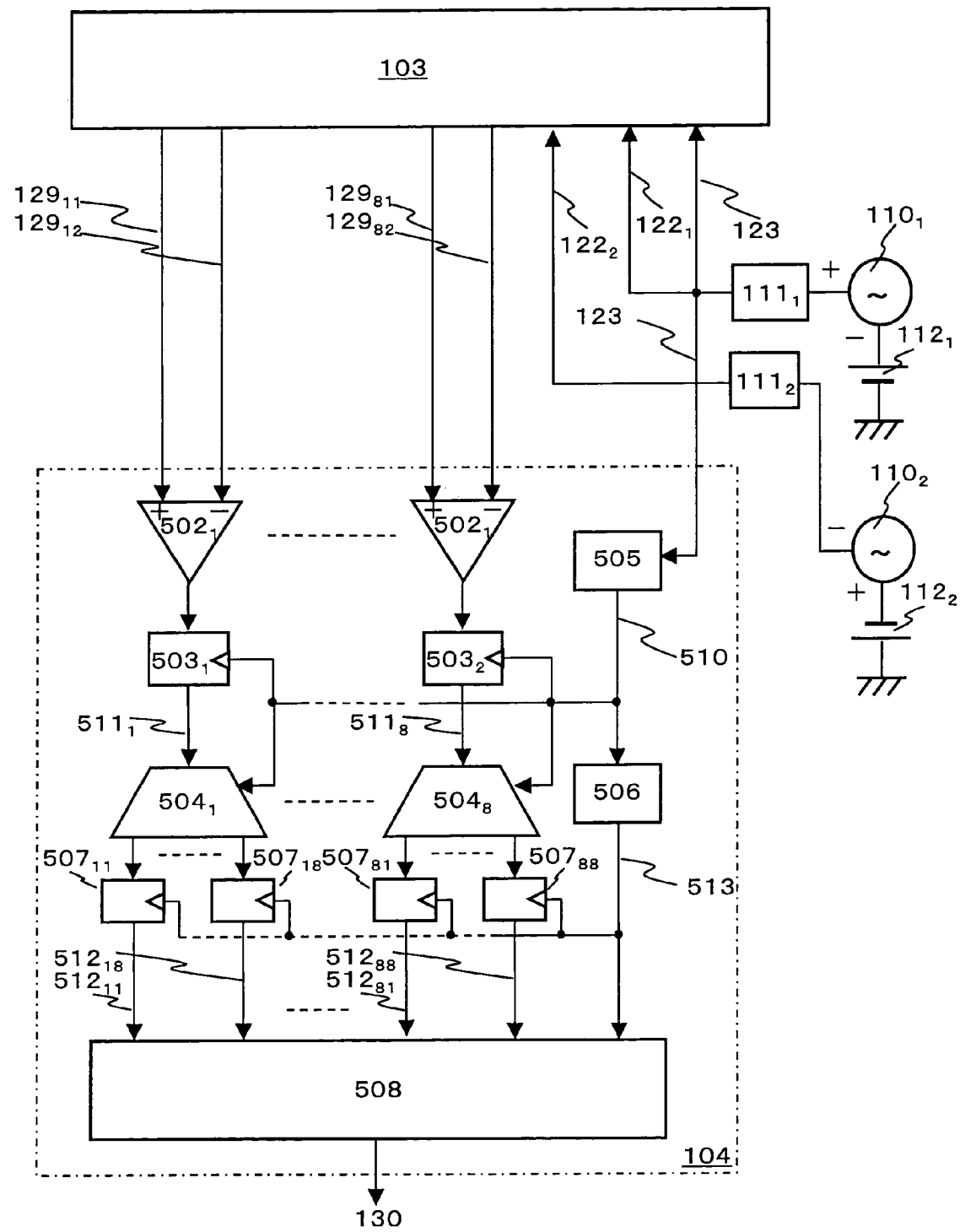
FIG. 17 is a block diagram, as Embodiment 4, showing the connection of the superconducting front-end circuit 103 and the semiconductor back-end circuit 104 in the A/D converter using two output voltages $129_1$ and $129_2$ of FIG. 14 whose only polarities are opposite each other and the construction of the semiconductor back-end circuit 104.

FIG. 17 is a block diagram showing the connection between the superconducting front-end circuit 103 and the semiconductor back-end circuit 104 in the A/D converter shown in FIG. 1 and the construction of the semiconductor back-end circuit 104. In Embodiment 4, the number of channels of the voltage data signal 129 outputted from the superconducting front-end circuit 103 is eight. The voltage data signal 129 shown in FIG. 1, as indicated by the voltage data signals $129_{11}$, $129_{12}$, $129_{81}$ and $129_{82}$, is a differential signal having two voltage data signals per channel. For the transmission of the voltage data signal from the superconducting front-end circuit 103 to the semiconductor back-end circuit 104, two transmission lines per channel and 16 transmission lines per eight channels are used.

The voltage data signal 129 transmitted to the semiconductor back-end circuit 104 is amplified by a sense amplifier circuit 502 having differential inputs, and after lowering the frequency by a demultiplexing circuit 504, is then inputted to a digital signal processor 508. The digital signal processor 508 converts the voltage data signal 129 via a decimation filter, not shown, in the processor 508 and a digital low-pass filter, not shown, to the digital data signal 130 with a high accuracy bit.

Figure 18:
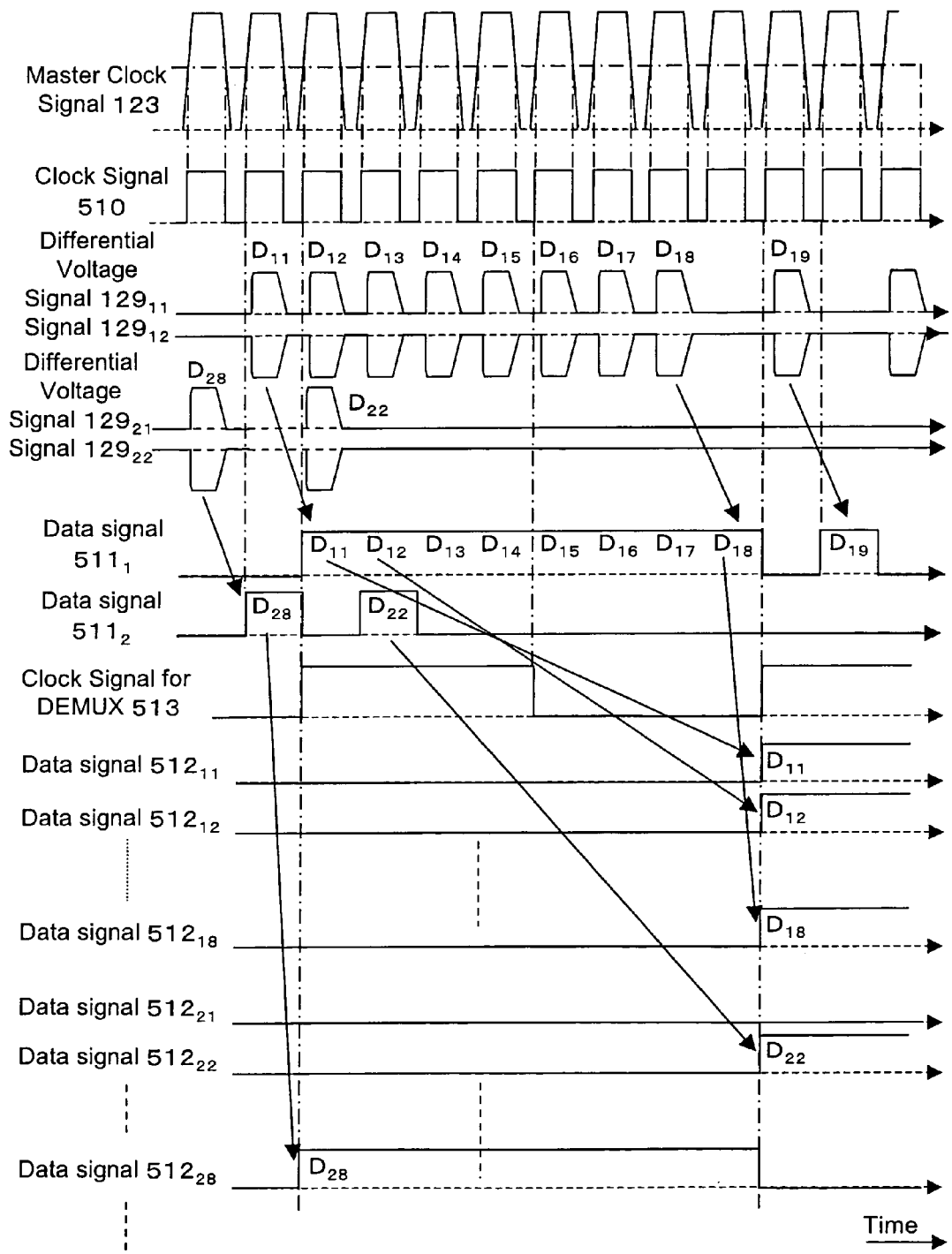
FIG. 18 is a diagram showing an operation time chart of the circuits of FIG. 17.

FIG. 18 is a diagram of assistance in explaining the flows of the voltage data signals in the semiconductor back-end circuit 104. In the voltage data signal 129 for two channels, that is, the respective voltage data signals $129_1$ and $129_2$, the signal waveforms $129_{11}$, $129_{12}$, $129_{21}$ and $129_{22}$ of the differential voltage data are shown. Here, unlike the SFQ data signal 126 described in FIG. 2, in the differential voltage data signals $129_{11}$ and $129_{12}$, the SFQ data signals 126 corresponding to 1 to 8 of the SFQ trigger signals 124 described in FIG. 2 are obtained, and these are indicated by $D_{11}$ to $D_{18}$. In the differential voltage data signals $129_{21}$ and $129_{22}$, the SFQ data signals 126 corresponding to 8 and 2 of the SFQ trigger signals 124 described in FIG. 2 are obtained, and these are indicated by $D_{28}$ and $D_{22}$.

The differential voltage data signal 129 inputted to the semiconductor back-end circuit 104 is amplified to several V by the sense amplifier circuit 502. In order that output timings of the channels are equal to be synchronized with the master clock signal 123, the amplified signal is stored in the latch circuit 503. A clock signal 510 is inputted as a trigger signal to the latch circuit 503. The clock signal 510 is generated by passing the master clock signal 123 driving the superconducting circuit through a clock waveform shaping circuit 505 constructed of a buffer gate. A data signal 511 from the latch circuit 503 is outputted in the timing of the clock signal 510 and is delayed by one cycle of the master clock signal 123 to the voltage data signal 129. The arrows given from the differential voltage data signals 129 to the data signals 511 in FIG. 18 mean this delay.

The data signal 511 is further eight-demultiplexed by the demultiplexing circuit 504 constructed of a semiconductor circuit. The number of demultiplexing channels is 64 for all channels. The clock signal to the demultiplexing circuit 504 is the same signal as the clock signal 510 used in the latch circuit 503. The demultiplexing operation lowers the frequency of the data signal from several GHz to hundreds of MHz. The data signals demultiplexed by the demultiplexing circuits 504 clock signal 510 have variations in the output timing every each channel since the output timings in each channel are sequential according to the coming of the clock signal 510. To make the timings equal in all channels, the demultiplexed signal is inputted to a latch circuit 507. The trigger signal supplied to the latch circuit 507 is a clock signal 513 obtained by eight-frequency-dividing the clock signal 510 by a frequency divider circuit 506. After the data signal is stored in the latch circuit 507 of all eight channels, the latch circuits $507_{11}$ to $507_{88}$ output data signals $512_{11}$ to $512_{88}$ at the same time corresponding to the rising of the clock signal 513 to transmit them to the digital signal processor 508. The data signal 512 is delayed by up to eight clocks to the data signal 511. The arrows given from the data signals 511 to the data signals 512 in FIG. 18 mean this delay. The data signal $511_1$ is separated into the voltage data signals $D_{11}, \ldots, D_{18}$ to be $512_{12}, \ldots, 512_{18}$. The data signal $511_2$ is separated into the voltage data signals $D_{28}, D_{18}$ to be $512_{22}, 512_{28}$.

The data signals processed by the digital signal processor 508 are outputted as the digital data signal 130. The clock signal operating the digital signal processor 508 may introduce the clock signal 513 to synchronize the operation of the processor with the output timing of the latch circuits $507_{11}$ to $507_{88}$.

What is claimed is:

1. A superconductor semiconductor integrated circuit which is a circuit having an integrated circuit connecting a single flux quantum analog-to-digital converter front-end circuit, a superconducting amplifier circuit and a semiconductor circuit, and an AC power source driving said integrated circuit, wherein said single flux quantum analog-to-digital converter front-end circuit is a circuit oversampling an analog signal as an input signal and outputting the sampling data as a digital current signal, has a single flux quantum generating circuit connected to said AC power source so that the sampling in said circuit and the output of the digital current signal are synchronized with an AC signal from said AC power source, and has a clock signal frequency multiplier circuit so as to perform sampling at a frequency higher than that of said AC signal, wherein said superconducting amplifier circuit is connected to said AC power source and said single flux quantum analog-to-digital converter front-end circuit so as to amplify the signal from said single flux quantum analog-to-digital converter front-end circuit by the AC signal from said AC power source, wherein said semiconductor circuit is connected to said superconducting amplifier circuit and said AC power source so as to perform digital signal processing of the signal from said superconducting amplifier circuit in synchronization with the AC signal from said AC power source for outputting a digital signal.

2. The superconductor semiconductor integrated circuit according to claim 1, wherein said single flux quantum analog-to-digital converter front-end circuit comprises:

a modulator circuit converting the analog input signal to a single flux quantum data signal by a single flux quantum clock signal outputted from said clock signal frequency multiplier circuit;

a demultiplexing circuit demultiplexing the single flux quantum data signal outputted from said modulator circuit into a plurality of channels by supplying the single flux quantum clock signal; and a memory circuit in which a single flux quantum data signal outputted from said demultiplexing circuit is an input signal and a second single flux quantum data signal outputted from said single flux quantum generating circuit is a trigger signal, wherein a data current signal from said memory circuit is outputted.

3. The superconductor semiconductor integrated circuit according to claim 2, further comprising:

said clock signal frequency multiplier circuit having a single flux quantum clock signal generating circuit generating a finite number of single flux quantum signals according to one single flux quantum signal;

a frequency divider circuit frequency-dividing the single flux quantum clock signal generated by said single flux quantum clock signal generating circuit;

a single flux quantum (SFQ) to dc converter circuit receiving, as an input, the single flux quantum clock signal frequency-divided by said frequency divider circuit; and control means changing the cycle of the single flux quantum generated by said single flux quantum clock signal generating circuit so that the duty ratio of the output signal of said single flux quantum (SFQ) to dc converter circuit is 50%.

4. The superconductor semiconductor integrated circuit according to claim 3, wherein said single flux quantum clock signal generating circuit in said clock signal frequency multiplier circuit is a ladder-type single flux quantum clock signal generating circuit generating $2^N$ single flux quantum clock signals at fixed intervals when the single flux quantum data signal outputted from a single flux quantum generating circuit is the trigger signal and N is a natural number, said frequency divider circuit has N−1 toggle flip-flop circuits cascade connected, and each time $2^{N-1}$ single flux quantum clock signals are generated, the output of said single flux quantum (SFQ) to dc converter circuit is transited between the voltage state and the zero-voltage state to control the generation interval between the single flux quantum clock signals.

5. The superconductor semiconductor integrated circuit according to claim 2, further comprising:

said clock signal frequency multiplier circuit having a single flux quantum clock signal generating circuit generating an infinite number of single flux quantum signals according to one single flux quantum signal;

a frequency divider circuit frequency-dividing the single flux quantum clock signal generated by said single flux quantum clock signal generating circuit;

a single flux quantum (SFQ) to dc converter circuit receiving, as an input, the single flux quantum clock signal frequency-divided by said frequency divider circuit; and control means changing the cycle of the single flux quantum generated by said single flux quantum clock signal generating circuit so that the difference between the phase of said single flux quantum (SFQ) to dc converter circuit and the phase of the AC signal from said AC power source is 0.

6. The superconductor semiconductor integrated circuit according to claim 2, wherein said demultiplexing circuit has a binary-tree type demultiplexing circuit, when M is a power of 2, demultiplexing the single flux quantum data signal from said modulator circuit into M output channels together with the single flux quantum clock signal, and a shift-dump type demultiplexing circuit, when N is a natural number, demultiplexing the single flux quantum data signal into N output channels, connecting the respective flux quantum data signals and single flux quantum clock signals demultiplexed by said binary-tree type demultiplexing circuit to M shift-dump type demultiplexing circuits to demultiplex them into M×N output channels.

7. The superconductor semiconductor integrated circuit according to claim 6, wherein in said demultiplexing circuit, to demultiplex the single flux quantum data signal at high speed and to maintain the timing margin of the demultiplexed single flux quantum data signal, the number of output channels M of said binary-tree type demultiplexing circuit and the number of output channels N of said shift-dump type demultiplexing circuit are limited by values indicated by equations (1) and (2) when the frequency of an input clock signal is $f_{CLK}$, the maximum operation frequency of the shift-dump type demultiplexing circuit is $f_{SDMAX}$, and the minimum timing margin with the later-stage circuit is $T_{LTMIN}$.

$$M > \frac{f_{CLK}}{f_{SDMAX}} \quad (1)$$

$$N > \frac{f_{CLK} \cdot T_{LTMIN}}{M+1} \quad (2)$$

8. The superconductor semiconductor integrated circuit according to claim 2, wherein said memory circuit, to store the single flux quantum data signal as an input signal during at least one cycle of said trigger signal, is composed by connecting the input terminal of a first data flip-flop circuit to the output terminal of said demultiplexing circuit, connecting the output terminal of said first data flip-flop circuit to the input terminal of a second data flip-flop circuit, receives the single flux quantum data signal as the trigger signal from said single flux quantum generating circuit to the trigger input terminals of the first and second data flip-flop circuits, and outputs the presence or absence of the electric current of a loop inductor of the second data flip-flop circuit as an output signal corresponding to the single flux quantum data signal.

9. The superconductor semiconductor integrated circuit according to claim 2, wherein said superconducting amplifier circuit amplifying the electric current of said loop inductor of said memory circuit has a superconducting quantum interference device magnetically coupled to said loop inductor of said memory circuit, and a stack type amplifier circuit amplifying a voltage signal outputted from said superconducting quantum interference device, and said stack type amplifier circuit and said superconducting quantum interference device are biased by an AC signal of said AC power source.

10. The superconductor semiconductor integrated circuit according to claim 9, wherein said superconducting amplifier circuit has said first superconducting quantum interference device and said first stack type amplifier circuit amplifying a voltage signal outputted from said first superconducting quantum interference device or said second superconducting quantum interference device and said second stack type amplifier circuit amplifying a voltage signal outputted from said second superconducting quantum interference device, said first superconducting quantum interference device and said first stack type amplifier circuit are biased by AC currents of said AC power source, and said second superconducting quantum interference device and said second stack type amplifier circuit are biased by AC currents of said AC power source having reversed phases.

11. The superconductor semiconductor integrated circuit according to claim 10, wherein the input terminal of said first memory circuit is connected to the input terminal of said second memory circuit so that the first and second memory circuits receive, as an input, the same single flux quantum data signal from said demultiplexing circuit, said loop inductor of said first memory circuit and said first superconducting quantum interference device, and said loop inductor of said second memory circuit and said second superconducting quantum interference device are magnetically coupled, respectively, thereby being constructed of said first stack type amplifier circuit amplifying a voltage signal outputted from said first superconducting quantum interference device and said second stack type amplifier circuit amplifying a voltage signal outputted from said second superconducting quantum interference device, and said first superconducting quantum interference device, said first stack type amplifier circuit are biased by AC currents of said AC power source, and said second superconducting quantum interference device and said second stack type amplifier circuit are biased by AC currents of said AC power sources having reversed phases.

* * * * *